United States Patent
Higashi

(10) Patent No.: US 8,169,016 B2
(45) Date of Patent: May 1, 2012

(54) NONVOLATILE SEMICONDUCTOR MEMORY DEVICE AND METHOD OF MANUFACTURING THE SAME

(75) Inventor: Kazuyuki Higashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 12/874,869

(22) Filed: Sep. 2, 2010

(65) Prior Publication Data

US 2011/0057250 A1    Mar. 10, 2011

(30) Foreign Application Priority Data

Sep. 4, 2009   (JP) ................. 2009-205004

(51) Int. Cl.
*H01L 29/76*   (2006.01)
(52) U.S. Cl. ........ 257/314; 257/315; 257/316; 257/321; 257/319; 257/324; 257/E29.309
(58) Field of Classification Search ................. 257/314, 257/315, 316, 321, 319, 324, E29.309
See application file for complete search history.

(56) References Cited

U.S. PATENT DOCUMENTS

2007/0252201 A1   11/2007   Kito et al.

FOREIGN PATENT DOCUMENTS

| JP | 2007-266143 | 10/2007 |
|----|-------------|---------|
| JP | 2008-171918 | 7/2008 |
| JP | 2009-099997 | 5/2009 |
| JP | 2009-117843 | 5/2009 |
| JP | 2009-135326 | 6/2009 |
| JP | 2009-146954 | 7/2009 |

OTHER PUBLICATIONS

Office Action in Japanese Patent Application No. 2009-205004, dated Dec. 5, 2011 (w/English translation).

*Primary Examiner* — Tan N Tran

(74) *Attorney, Agent, or Firm* — Oblon, Spivak, McClelland, Maier & Neustadt, L.L.P.

(57) ABSTRACT

A plurality of conductive layers are stacked in a first region and a second region. A semiconductor layer is surrounded by the conductive layers in the first region, includes a columnar portion extending in a perpendicular direction with respect to a substrate. A charge storage layer is formed between the conductive layers and a side surface of the columnar portion. The conductive layers includes first trenches, second trenches, and third trenches. The first trenches are arranged in the first region so as to have a first pitch in a first direction. The second trenches are arranged in the second region so as to have a second pitch in the first direction. The third trenches are arranged in the second region so as to have a third pitch in the first direction and so as to be sandwiched by the second trenches.

20 Claims, 38 Drawing Sheets

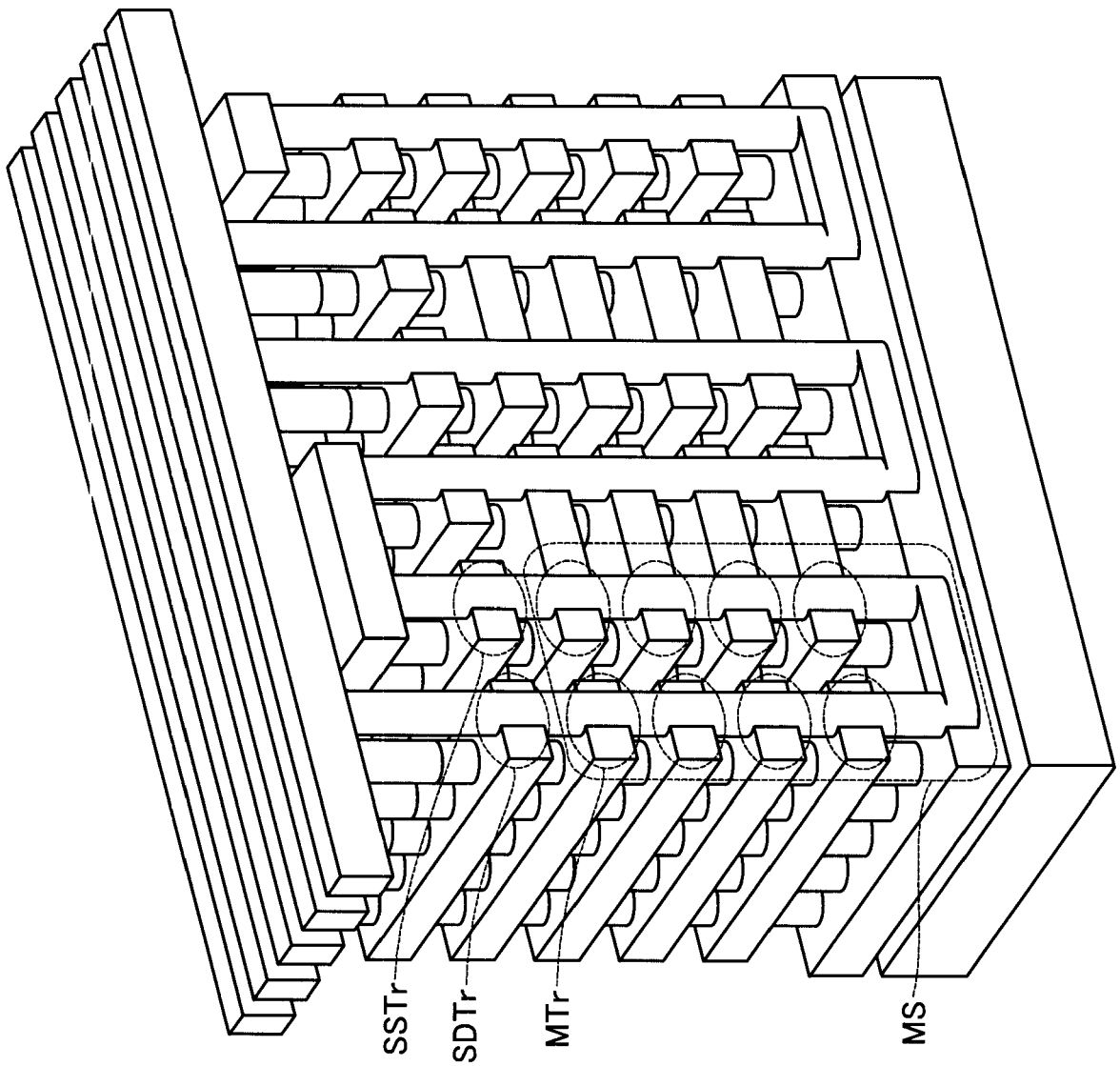
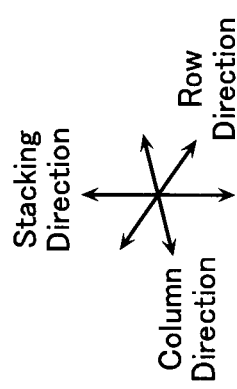
FIG. 2

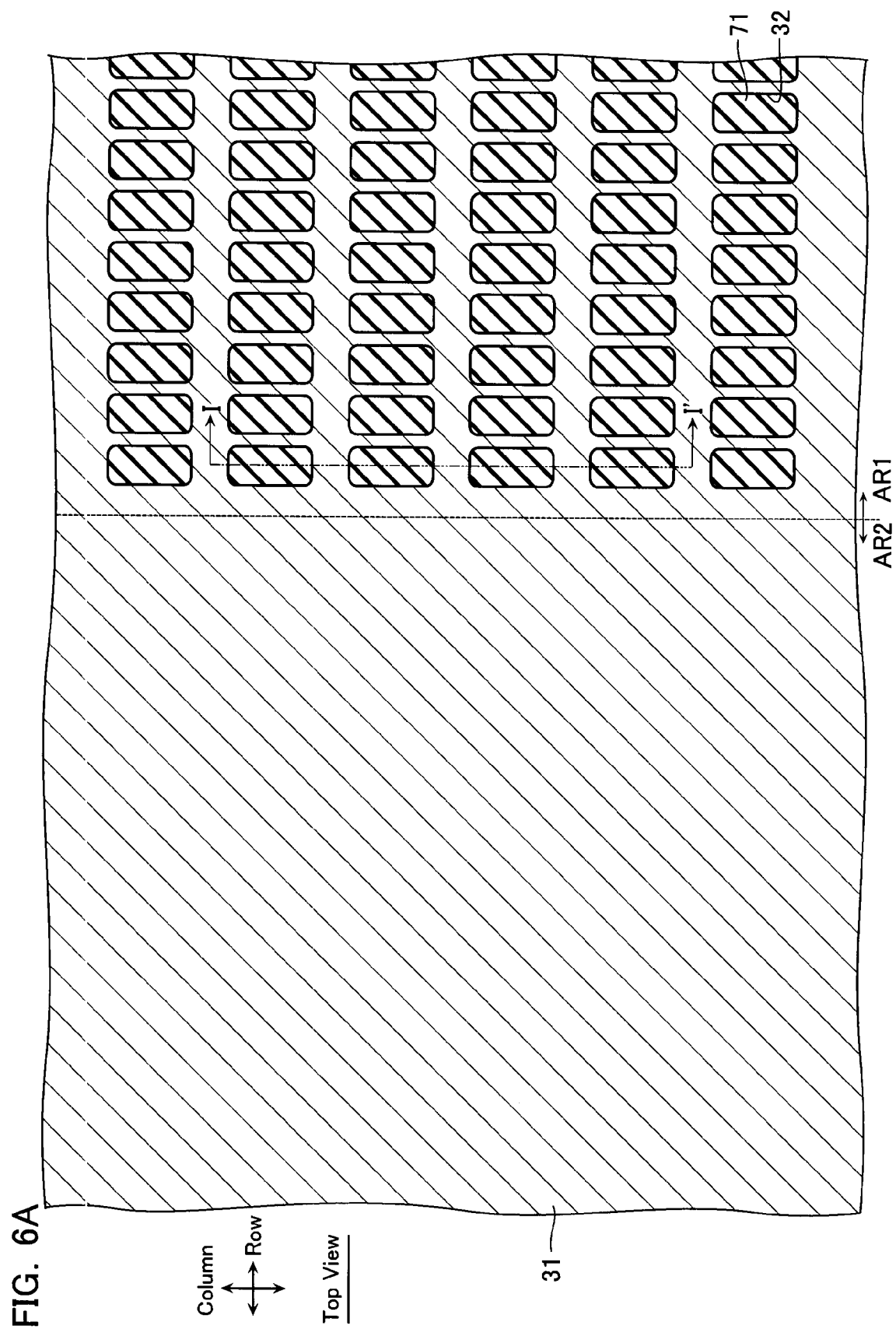

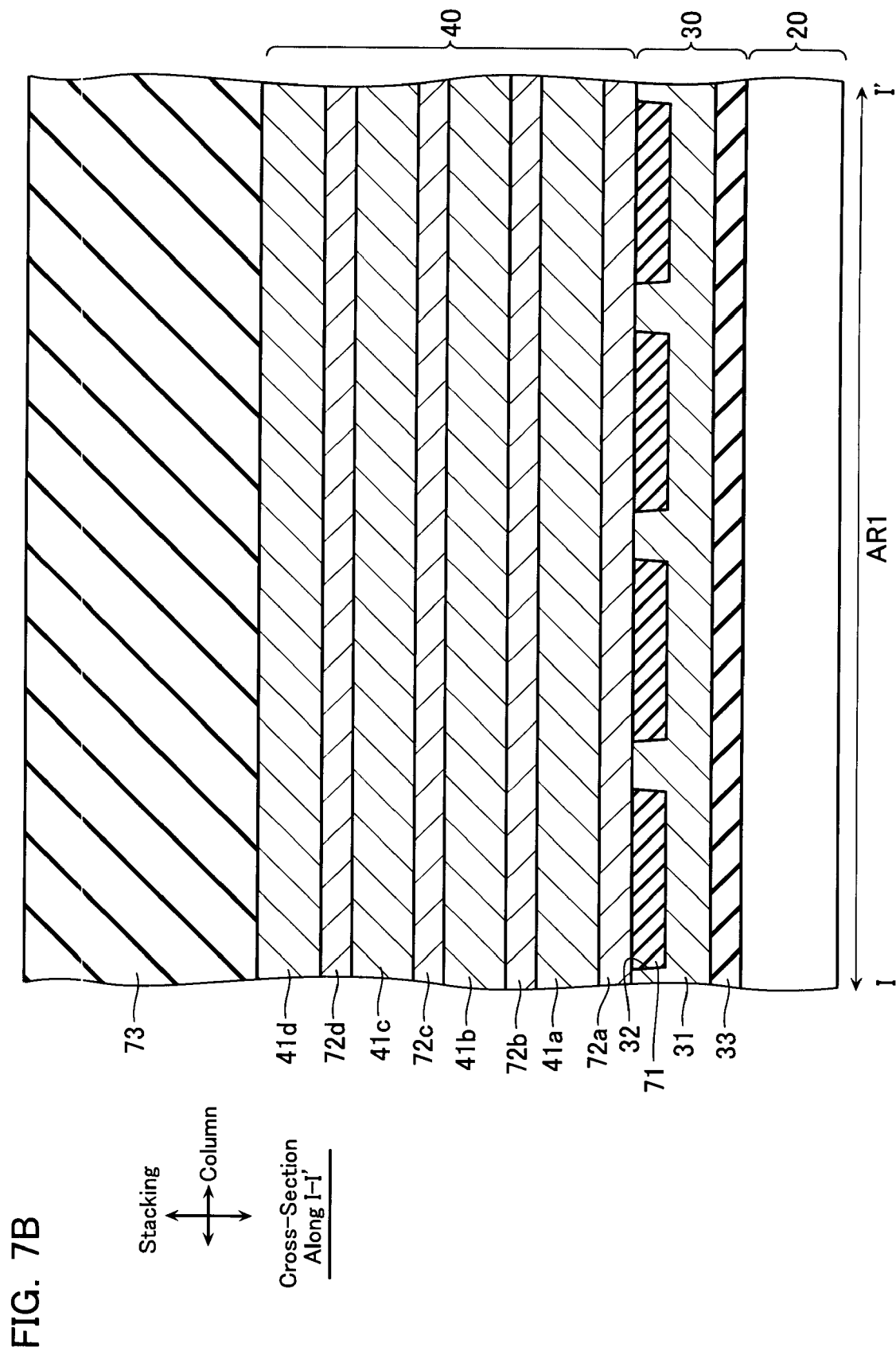

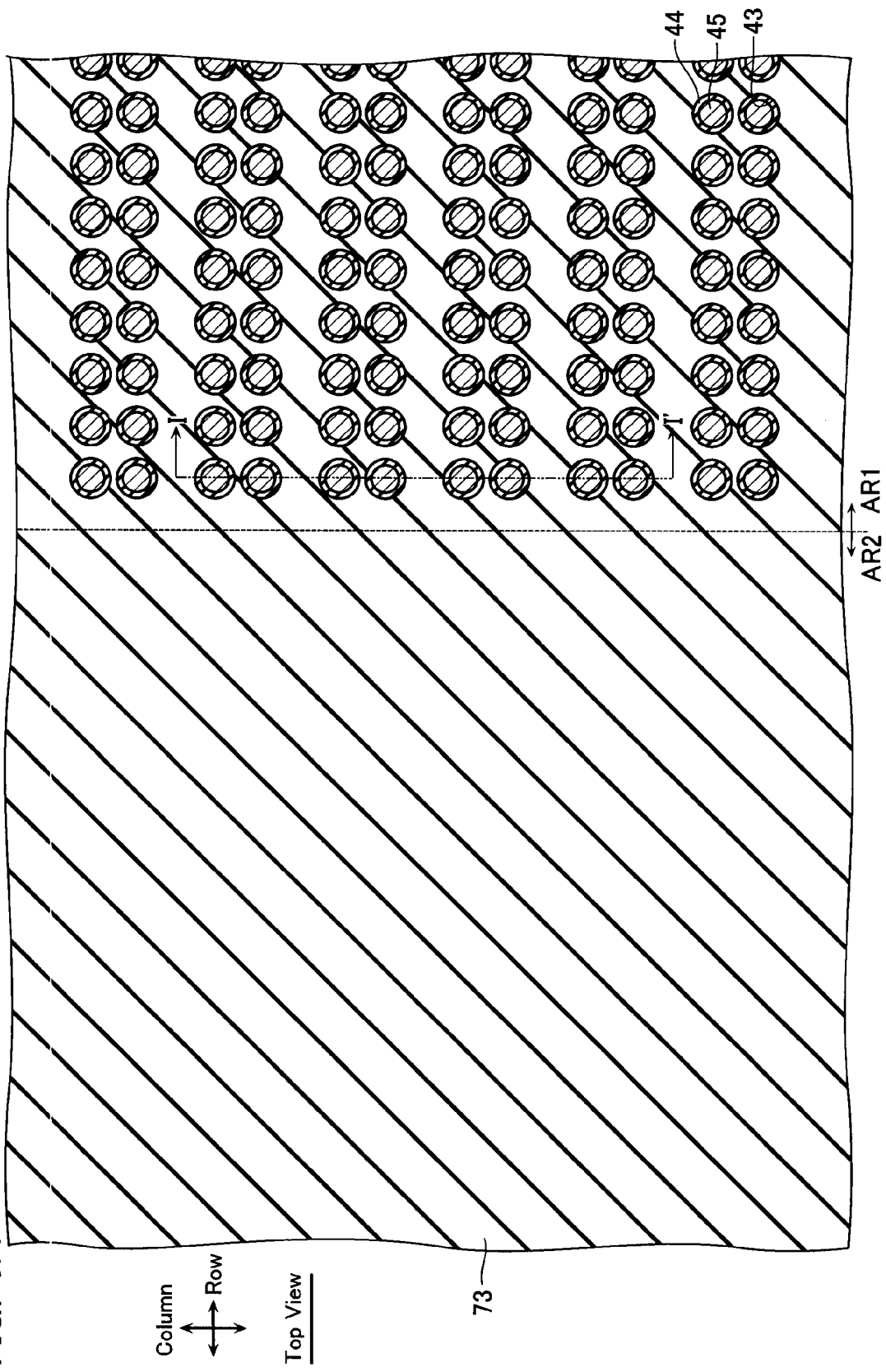

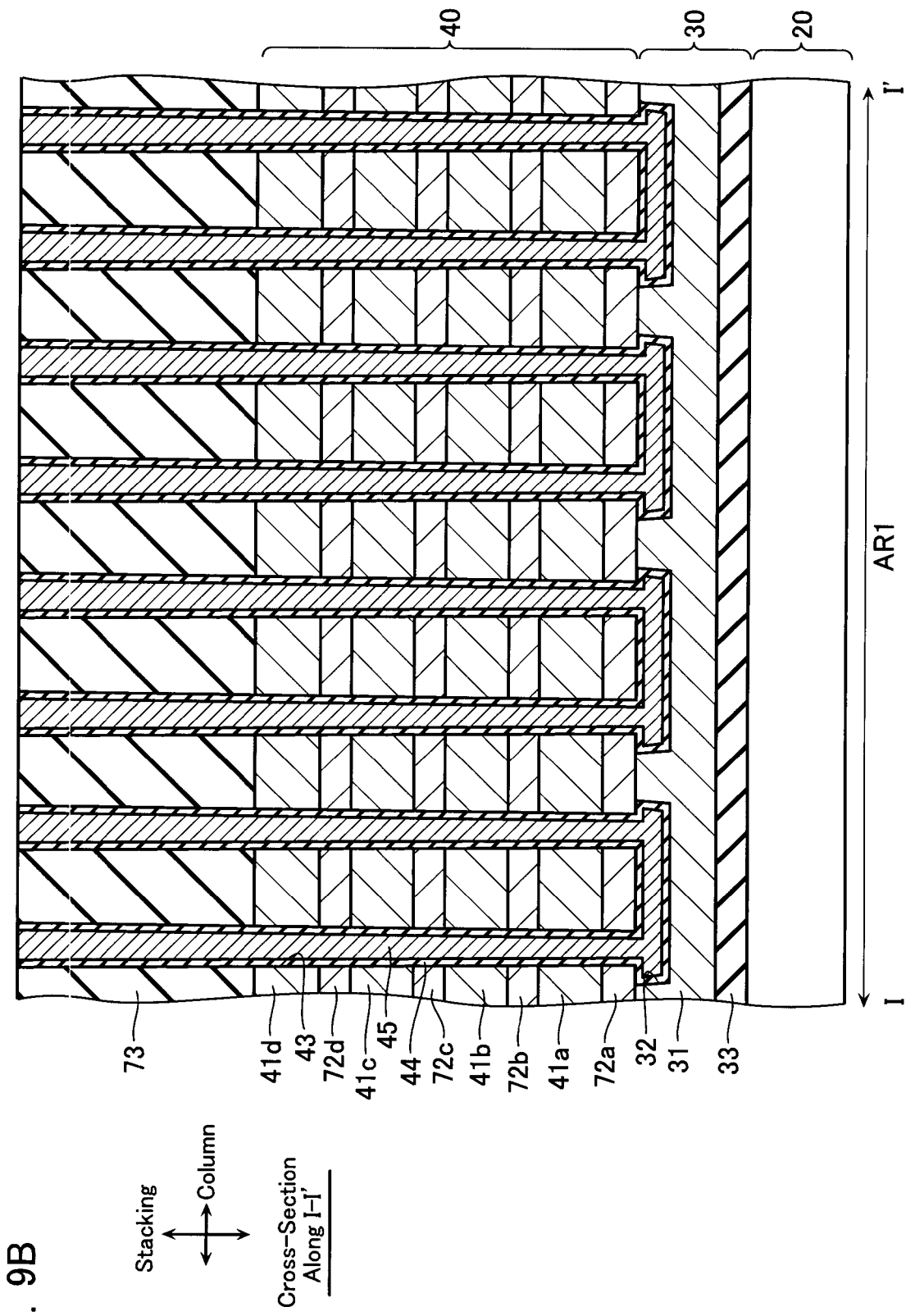

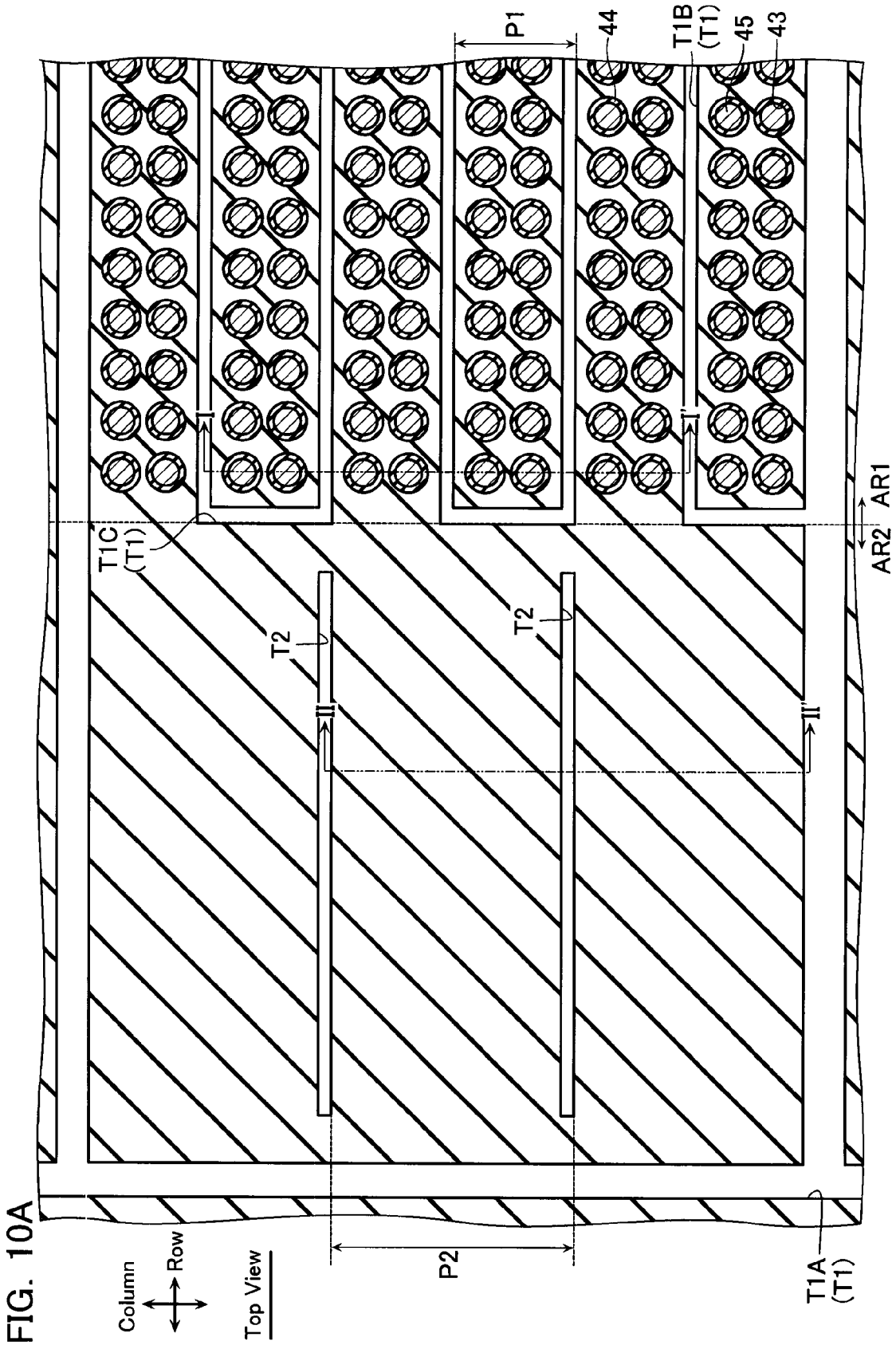

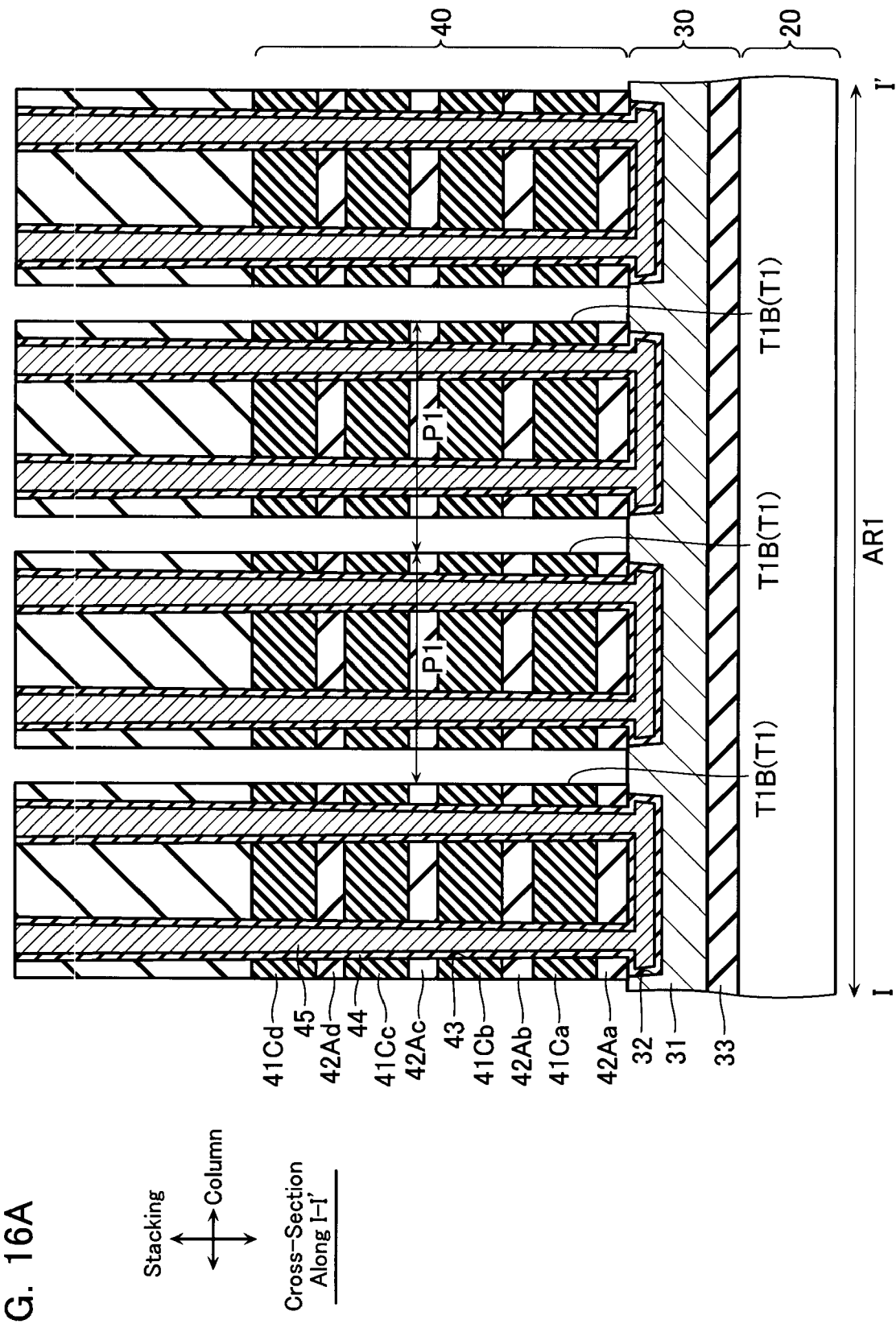

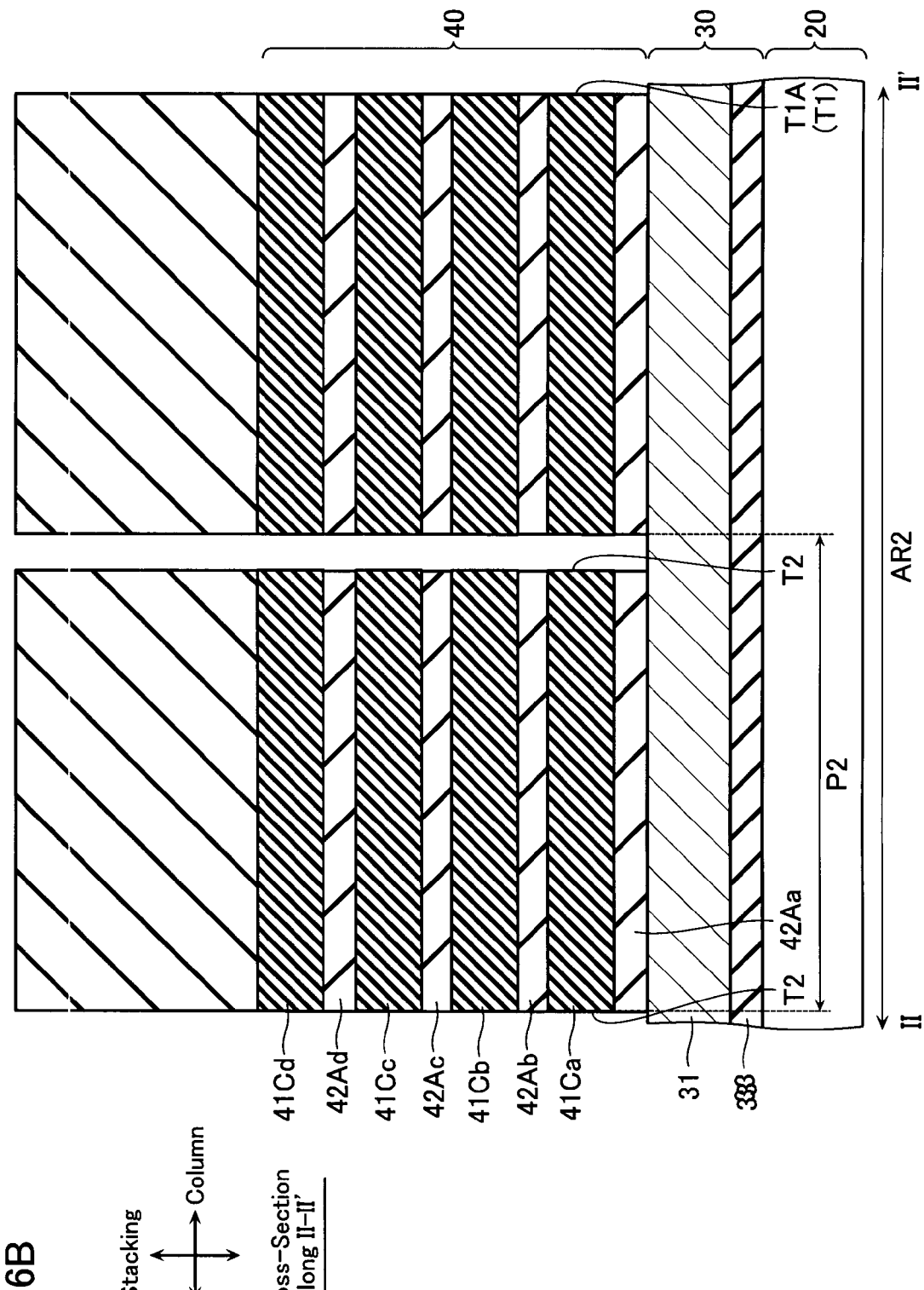

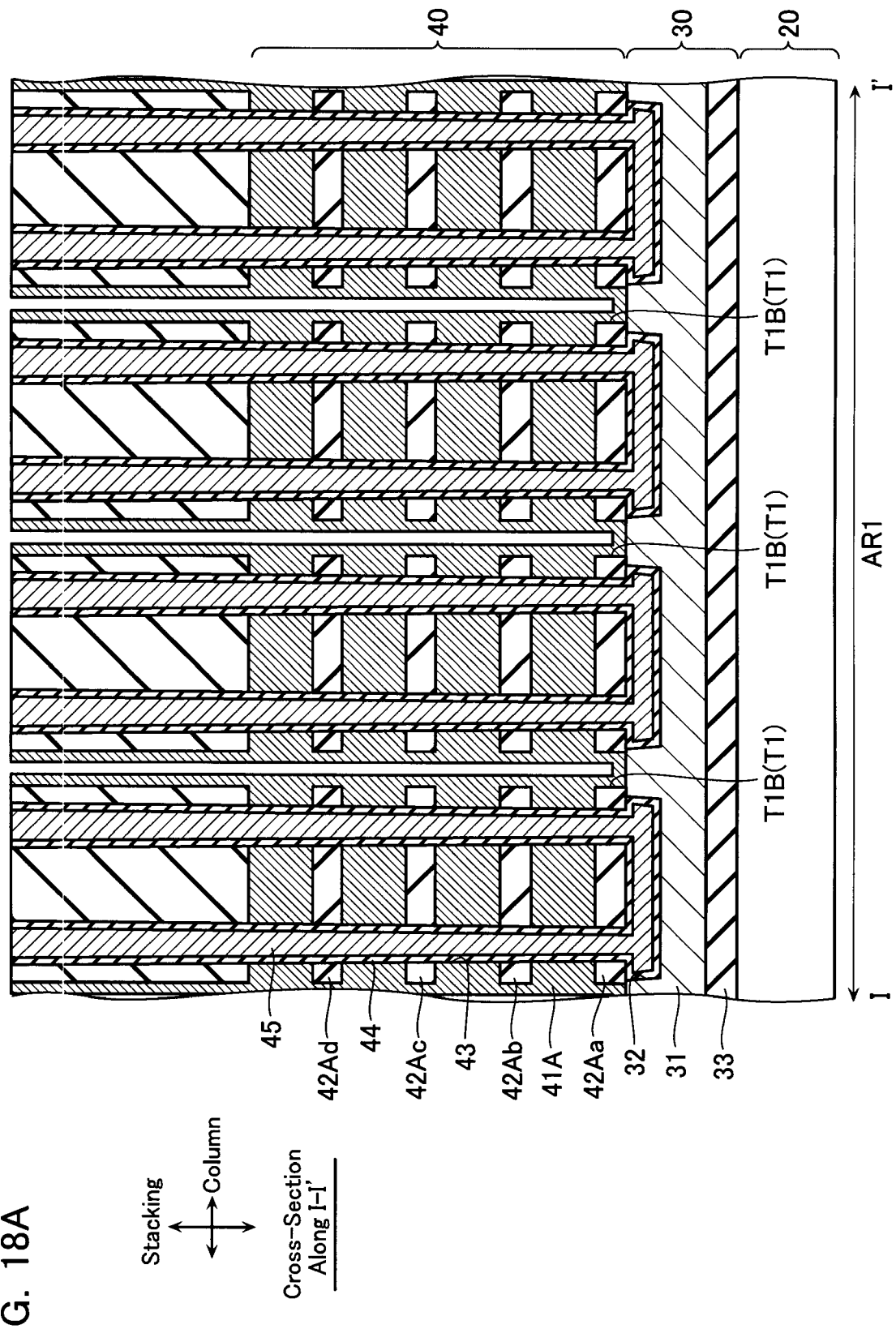

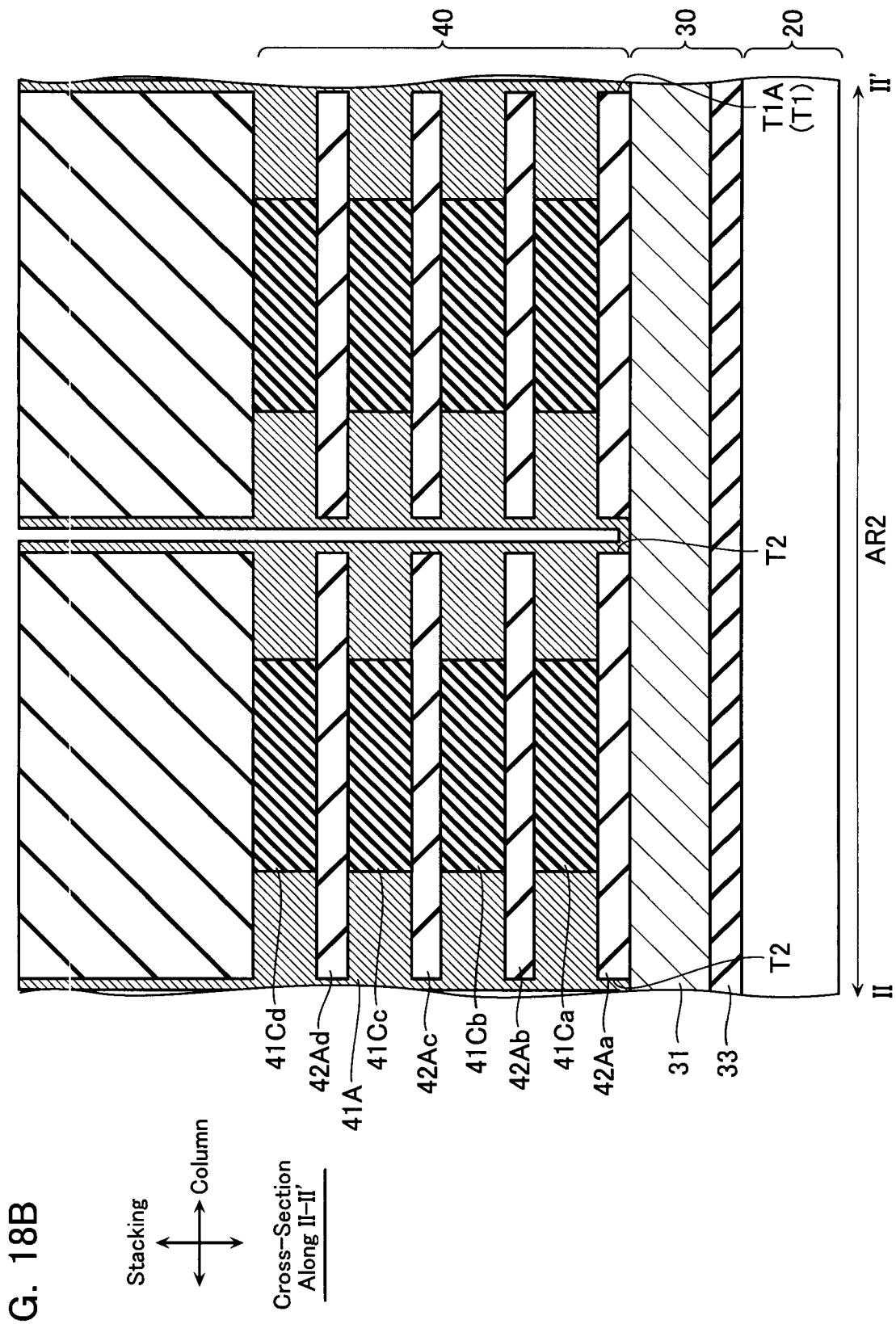

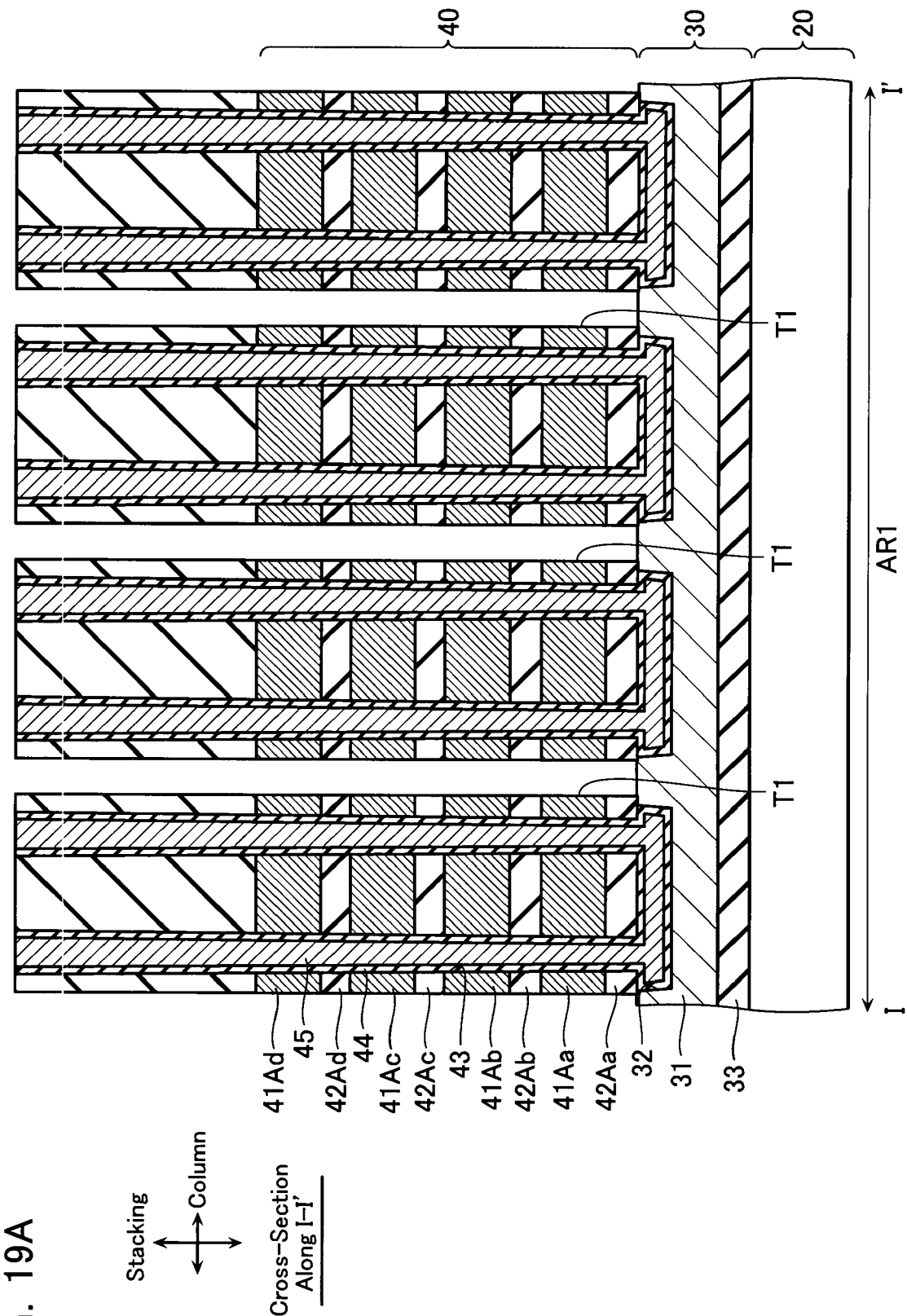

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from the prior Japanese Patent Application No. 2009-205004, filed on Sep. 4, 2009, the entire contents of which are incorporated herein by reference.

FIELD

Embodiments described herein relates to a nonvolatile semiconductor memory device and a method of manufacturing the same.

BACKGROUND

In recent years, many semiconductor memory devices are proposed in which memory cells are disposed three-dimensionally to increase the degree of integration of memory.

For example, a nonvolatile semiconductor memory device includes a memory region having memory cells arranged therein, and a peripheral region positioned in the periphery of the memory region. Further, the structure of this nonvolatile semiconductor memory device includes a plurality of conductive layers (silicon (Si)) and insulating layers (silicon oxide ($SiO_2$)) stacked in the memory region and the peripheral region, and a column-shaped semiconductor layer (silicon (Si)) extending so as to penetrate these conductive layers and insulating layers. The conductive layers include a stepped portion formed in a stepped shape in a peripheral region thereof to allow contact with wiring in an upper layer. Moreover, in the memory region, the conductive layers function as control gates of the memory transistors (memory cells) and the semiconductor layer functions as a channel (body) of the memory transistors (memory cells).

However, since the above-described conductive layers and insulating layers have etching rates that differ greatly, it is difficult to form holes penetrating the conductive layers and insulating layers in one lot. Furthermore, there is a need to prevent faults from being generated in the stepped portion during manufacturing processes.

BRIEF DESCRIPTION OF THE DRAWINGS

FIG. 2 is a schematic perspective view of the nonvolatile semiconductor memory device 100 in accordance with the first embodiment.

FIG. 6A is a top view showing a manufacturing process of the nonvolatile semiconductor memory device 100 in accordance with the first embodiment.

FIG. 7B is a cross-sectional view taken along the line I-I' of FIG. 7A.

FIG. 9A is a top view showing a manufacturing process of the nonvolatile semiconductor memory device 100 in accordance with the first embodiment.

FIG. 9B is a cross-sectional view taken along the line I-I' of FIG. 9A.

FIG. 10A is a top view showing a manufacturing process of the nonvolatile semiconductor memory device 100 in accordance with the first embodiment.

FIG. 16A is a cross-sectional view taken along the line I-I' of FIG. 10A showing a manufacturing process of the nonvolatile semiconductor memory device in accordance with the second embodiment.

FIG. 16B is a cross-sectional view taken along the line II-II' of FIG. 10A.

FIG. 18A is a cross-sectional view taken along the line I-I' of FIG. 10A.

FIG. 18B is a cross-sectional view taken along the line II-II' of FIG. 10A.

FIG. 19A is a cross-sectional view taken along the line I-I' of FIG. 10A.

DETAILED DESCRIPTION

According to one embodiment, a nonvolatile semiconductor memory device includes a first region having a plurality of electrically rewritable memory cells disposed therein, and a second region adjacent to the first region. The nonvolatile semiconductor memory device comprises a plurality of conductive layers, a semiconductor layer, and a charge storage layer. The plurality of conductive layers are stacked in the first region and the second region and function as control electrodes of the memory cells in the first region. The semiconductor layer is surrounded by the conductive layers in the first region, includes a columnar portion extending in a perpendicular direction with respect to a substrate, and functions as a body of the memory cells. The charge storage layer is formed between the conductive layers and a side surface of the columnar portion and is configured to enable storage of a charge and thereby retain data of the memory cells. The conductive layers comprises a plurality of first trenches, a plurality of second trenches, and a plurality of third trenches. The first trenches are arranged in the first region so as to have a first pitch in a first direction. The first trenches are formed in stripes having a second direction as a longitudinal direction, the second direction being perpendicular to the first direction. The first trenches are formed penetrating the plurality of conductive layers. The second trenches are arranged in the second region so as to have a second pitch in the first direction. The second trenches are formed in stripes having the second direction as a longitudinal direction. The second trenches are formed penetrating the plurality of conductive layers. The third trenches are arranged in the second region so as to have a third pitch in the first direction and so as to be sandwiched by the second trenches. The third trenches are formed in stripes having the second direction as a longitudinal direction. The third trenches are formed penetrating the plurality of conductive layers.

Embodiments of a nonvolatile semiconductor memory device are described below with reference to the drawings.

First Embodiment

Figure 1:
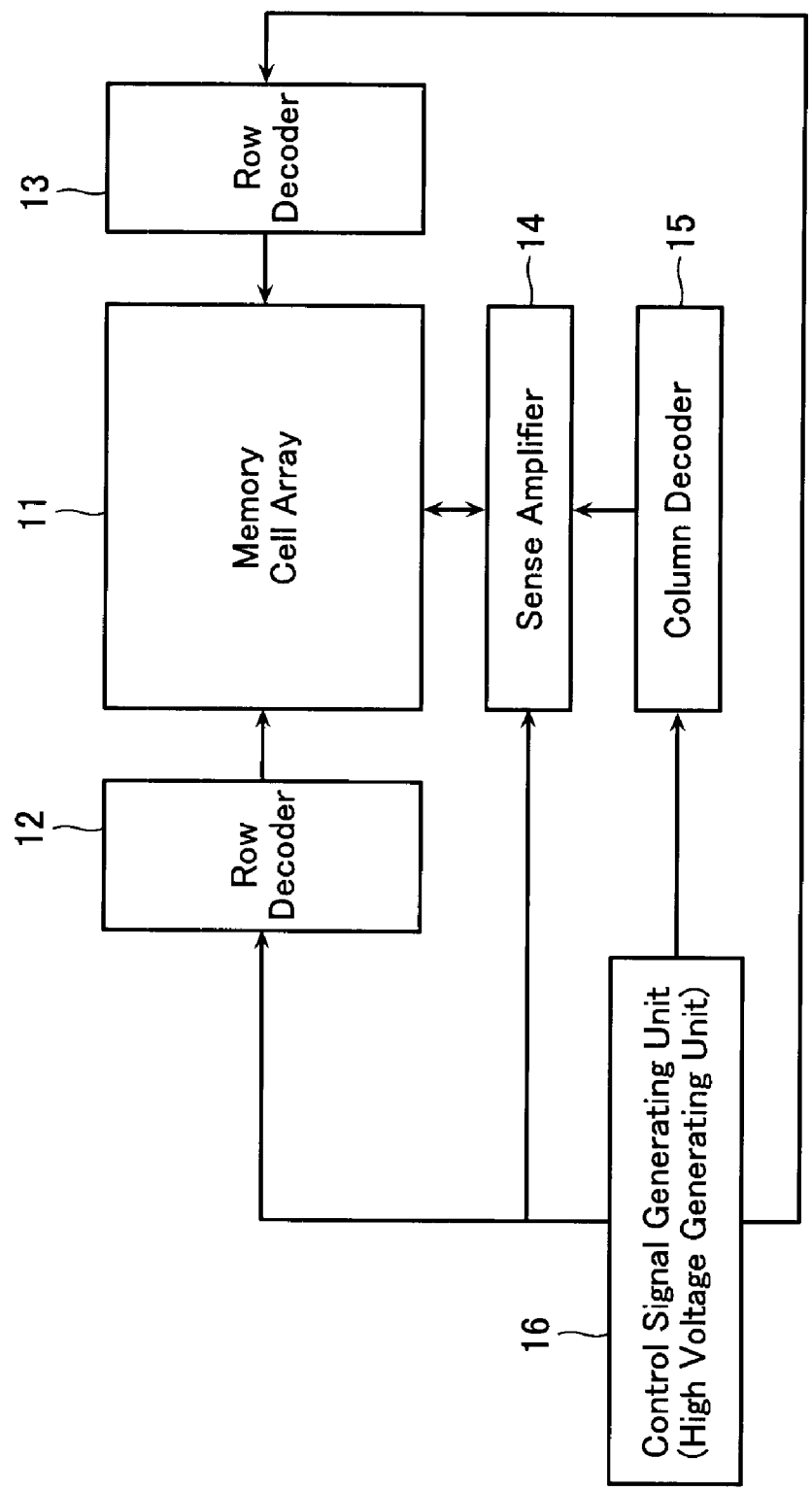
FIG. 1 is a block diagram of a nonvolatile semiconductor memory device 100 in accordance with a first embodiment.

Configuration of Nonvolatile Semiconductor Memory Device 100 in Accordance with First Embodiment First, a configuration of a nonvolatile semiconductor memory device 100 in accordance with a first embodiment is described with reference to FIG. 1. FIG. 1 is a block diagram of the nonvolatile semiconductor memory device 100 in accordance with the first embodiment of the present invention.

As shown in FIG. 1, the nonvolatile semiconductor memory device 100 in accordance with the first embodiment comprises a memory cell array 11, row decoders 12 and 13, a sense amplifier 14, a column decoder 15, and a control signal generating unit (high voltage generating unit) 16.

As shown in FIG. 2, the memory cell array 11 is configured having electrically data-storing memory transistors MTr (word line conductive layers 41) arranged in a three-dimensional matrix. That is, the memory transistors MTr, as well as being arranged in a matrix in a horizontal direction, are also arranged in a stacking direction. A plurality of the memory transistors MTr aligned in the stacking direction are connected in series to configure a widely known NAND string MS. Connected to the two ends of the NAND string MS are, respectively, a drain side select transistor SDTr and a source side select transistor SSTr, which are rendered conductive when selected. The NAND string MS is arranged having the stacking direction as a longitudinal direction.

As shown in FIG. 1, the row decoders 12 and 13 decode a block address signal and so on downloaded thereto, and control the memory cell array 11. The sense amplifier 14 reads data from the memory cell array 11. The column decoder 15 decodes a column address signal and controls the sense amplifier 14. The control signal generating unit 16 boosts a reference voltage to generate a high voltage required during write and erase, and, further, generates a control signal to control the row decoders 12 and 13, the sense amplifier 14, and the column decoder 15.

Figure 3:
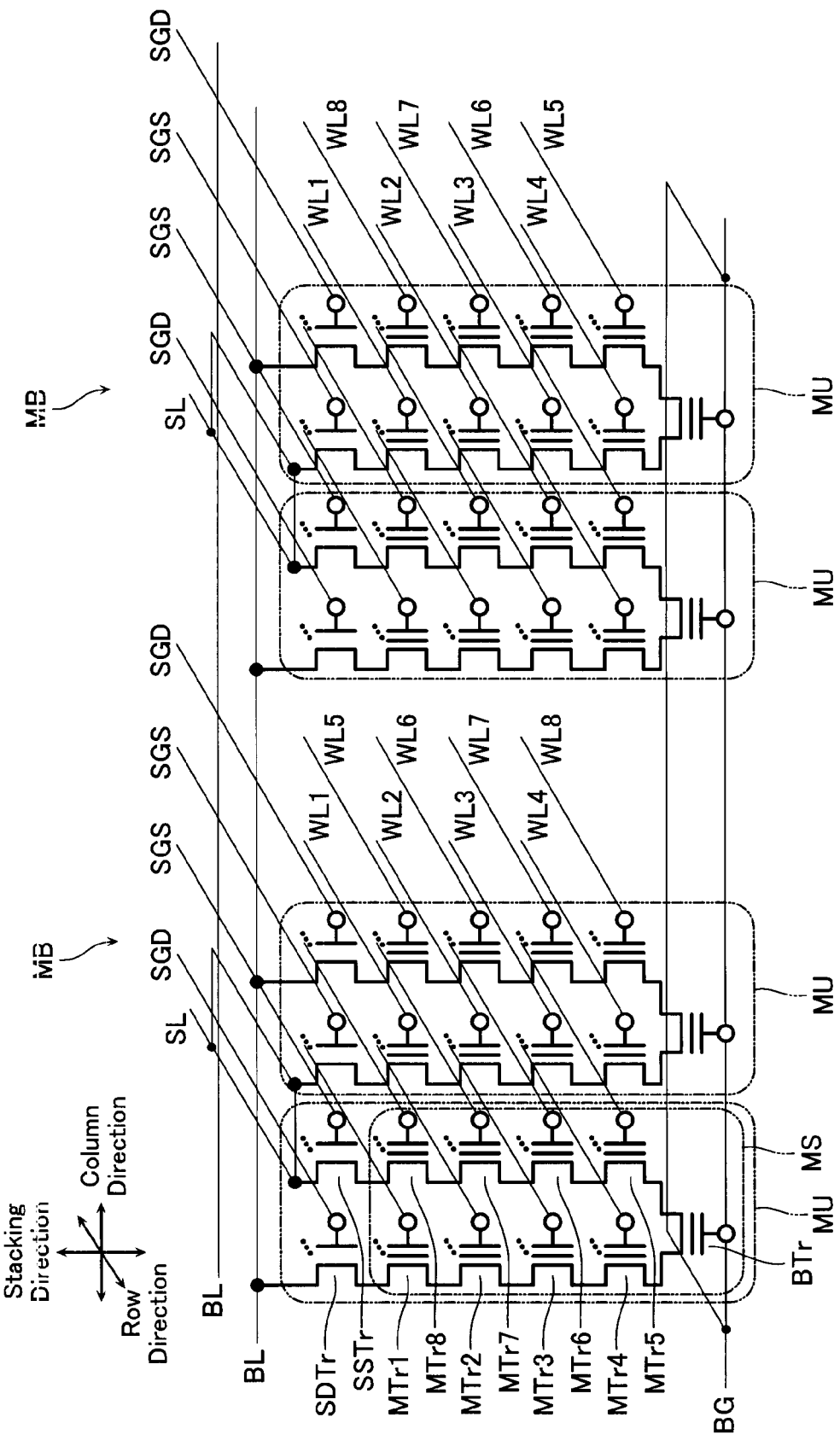
FIG. 3 is an equivalent circuit diagram of the nonvolatile semiconductor memory device 100 in accordance with the first embodiment.

Next, a circuit configuration of the memory cell array 11 is described with reference to FIG. 3. FIG. 3 is an equivalent circuit diagram of the memory transistors MTr, the select transistors SDTr and SSTr, and a peripheral circuit thereof, formed along a cross-section in a column direction of the memory cell array 11.

As shown in FIG. 3, the memory cell array 11 includes a plurality of bit lines BL and a plurality of memory blocks MB. The bit lines BL are formed in stripes extending in the column direction and having a certain pitch in a row direction. The memory blocks MB are provided repeatedly in the column direction with a certain pitch.

As shown in FIG. 3, each of the memory blocks MB includes a plurality of memory units MU commonly connected to the bit lines BL. Each of the memory units MU includes the memory string MS, the source side select transistor SSTr, and the drain side select transistor SDTr. The memory units MU adjacent in the column direction are formed such that a configuration thereof is mutually symmetrical in the column direction. The memory units MU are arranged in a matrix in the row direction and the column direction.

The memory string MS is configured by memory transistors MTr1-MTr8 and a back gate transistor BTr connected in series. The memory transistors MTr1-MTr4 are connected in series in the stacking direction. The memory transistors MTr5-MTr8 also are similarly connected in series in the stacking direction. The memory transistors MTr1-MTr8 store data by trapping a charge in a charge storage layer. The back gate transistor BTr is connected between the lowermost layer memory transistors MTr4 and MTr5. The memory transistors MTr1-MTr8 and the back gate transistor BTr are thus connected in a U shape in a cross-section in the column direction. A source of the drain side select transistor SDTr is connected to one end of the memory string MS (a drain of the memory transistor MTr1). A drain of the source side select transistor SSTr is connected to the other end of the memory string MS (a source of the memory transistor MTr8).

Gates of the memory transistors MTr1 in the memory units MU arranged in a line in the row direction are commonly connected to a word line WL1 extending in the row direction. Similarly, gates of the memory transistors MTr2-MTr8 arranged in lines in the row direction are commonly connected to word lines WL2-WL8, respectively, extending in the row direction. Note that two memory strings MS adjacent in the column direction both share the word lines WL1-WL8. Moreover, gates of the back gate transistors BTr arranged in a matrix in the row direction and the column direction are commonly connected to a back gate line BG.

Gates of each of the drain side select transistors SDTr in the memory units MU arranged in a line in the row direction are commonly connected to a drain side select gate line SGD extending in the row direction. Moreover, drains of the drain side select transistors SDTr arranged in a line in the column direction are commonly connected to the bit line BL.

Gates of each of the source side select transistors SSTr in the memory units MU arranged in a line in the row direction are commonly connected to a source side select gate line SGS extending in the row direction. Moreover, in pairs of the memory units MU adjacent in the column direction, sources of the source side select transistors SSTr arranged maline in the row direction are commonly connected to a source line SL extending in the row direction.

Figure 4A:
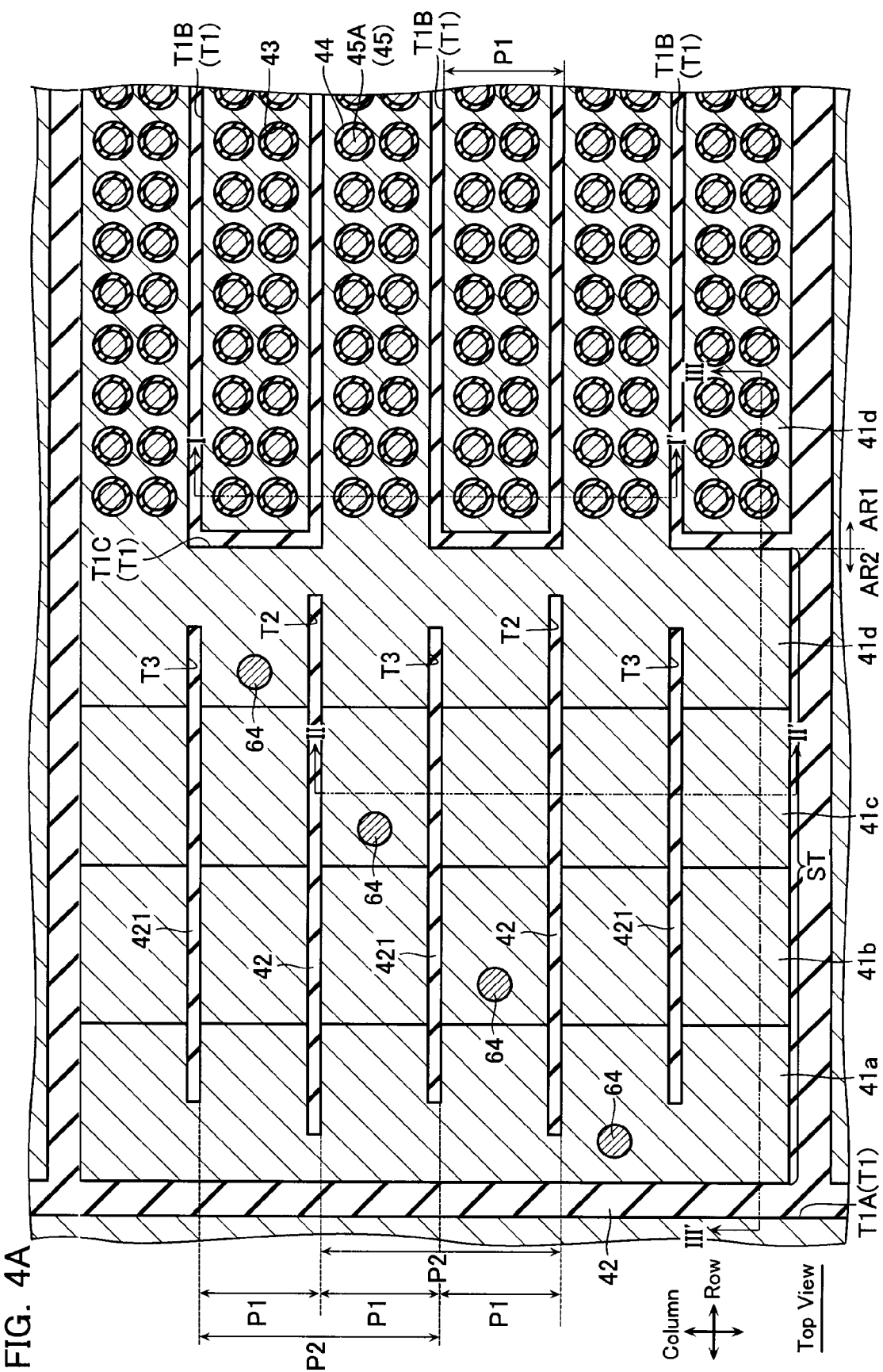
FIG. 4A is a schematic top view of the nonvolatile semiconductor memory device 100 in accordance with the first embodiment.
Figure 4B:
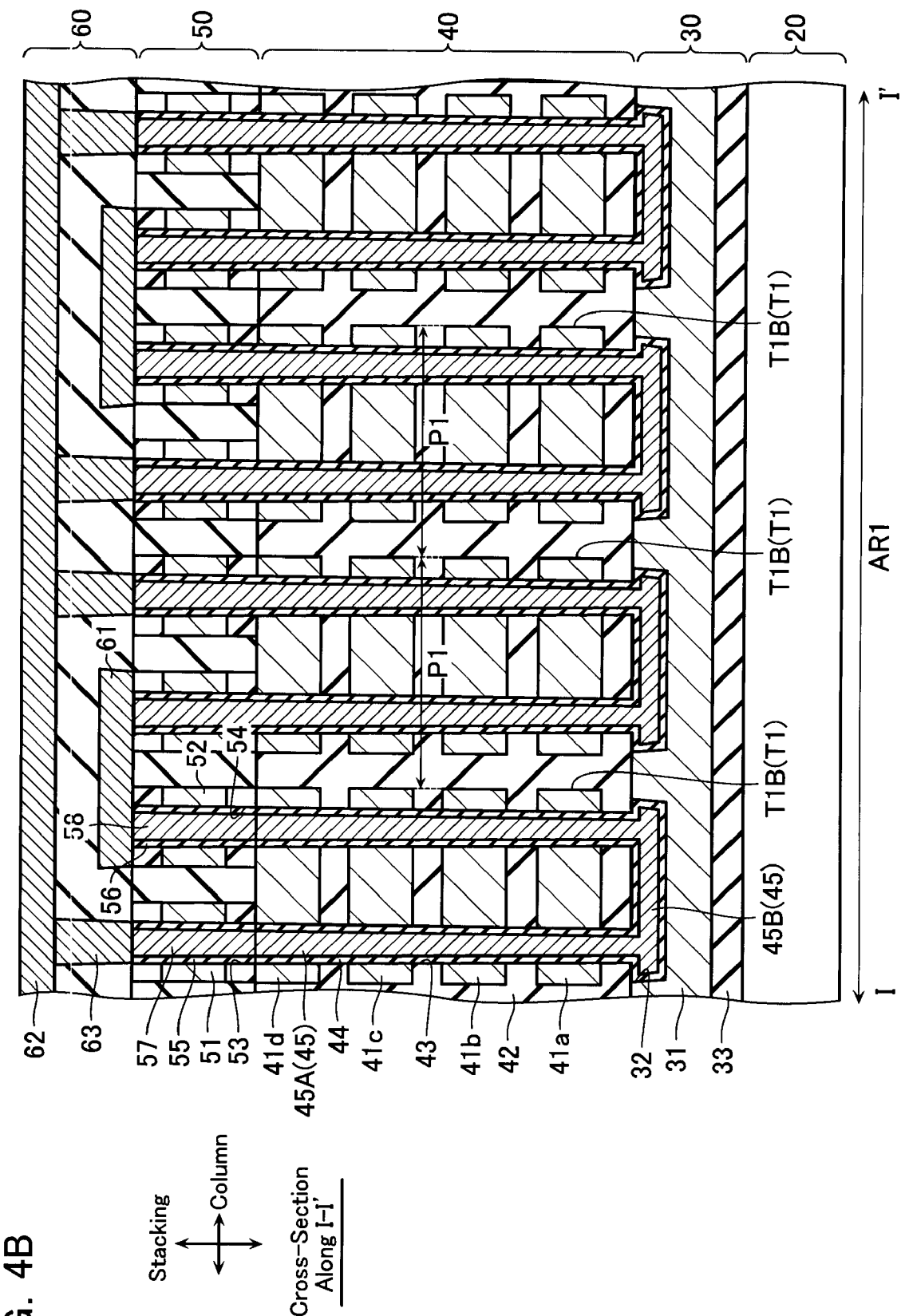
FIG. 4B is a cross-sectional view taken along the line I-I' of FIG. 4A.
Figure 4C:
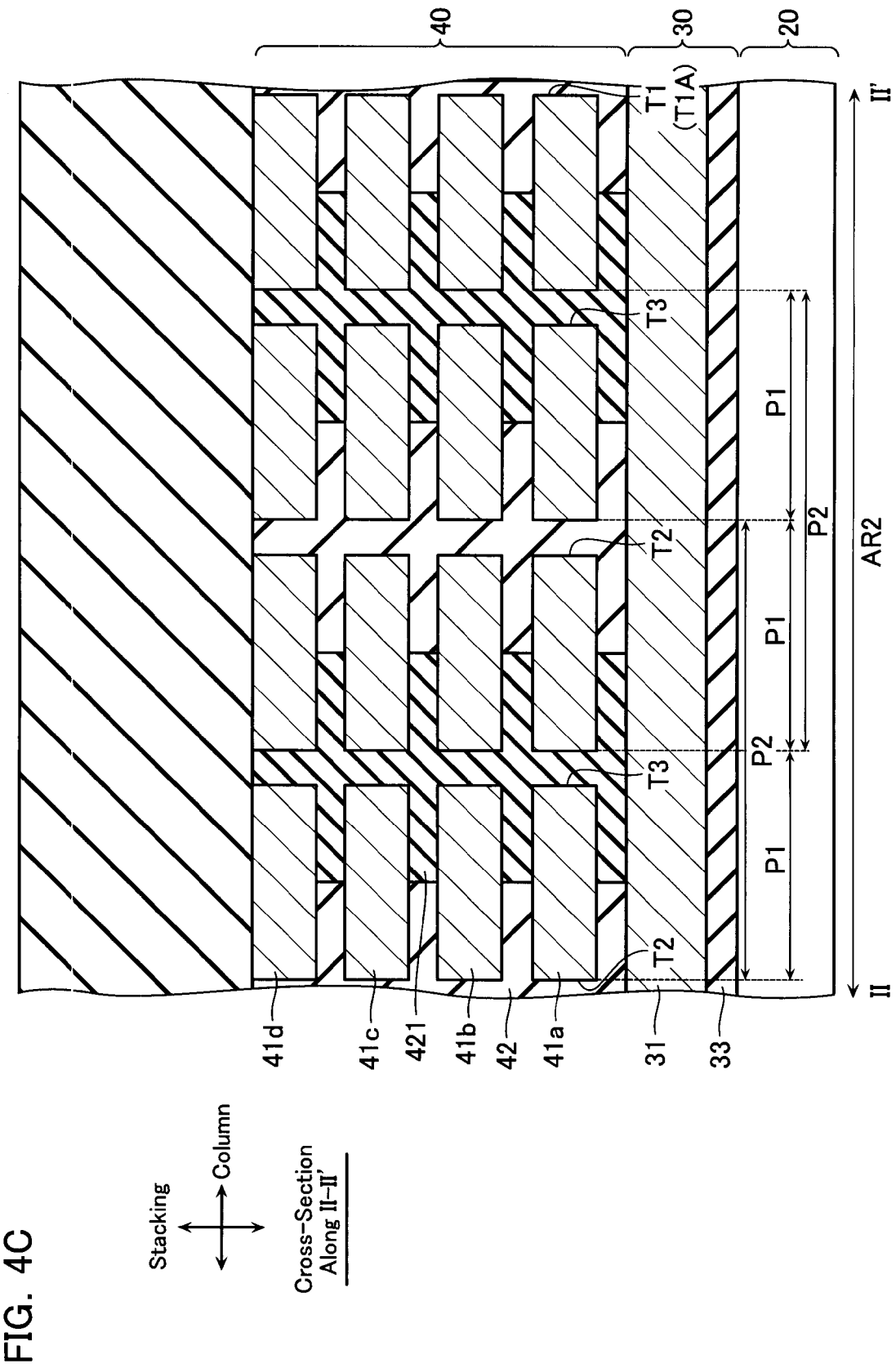
FIG. 4C is a cross-sectional view taken along the line II-II' of FIG. 4A.
Figure 4D:
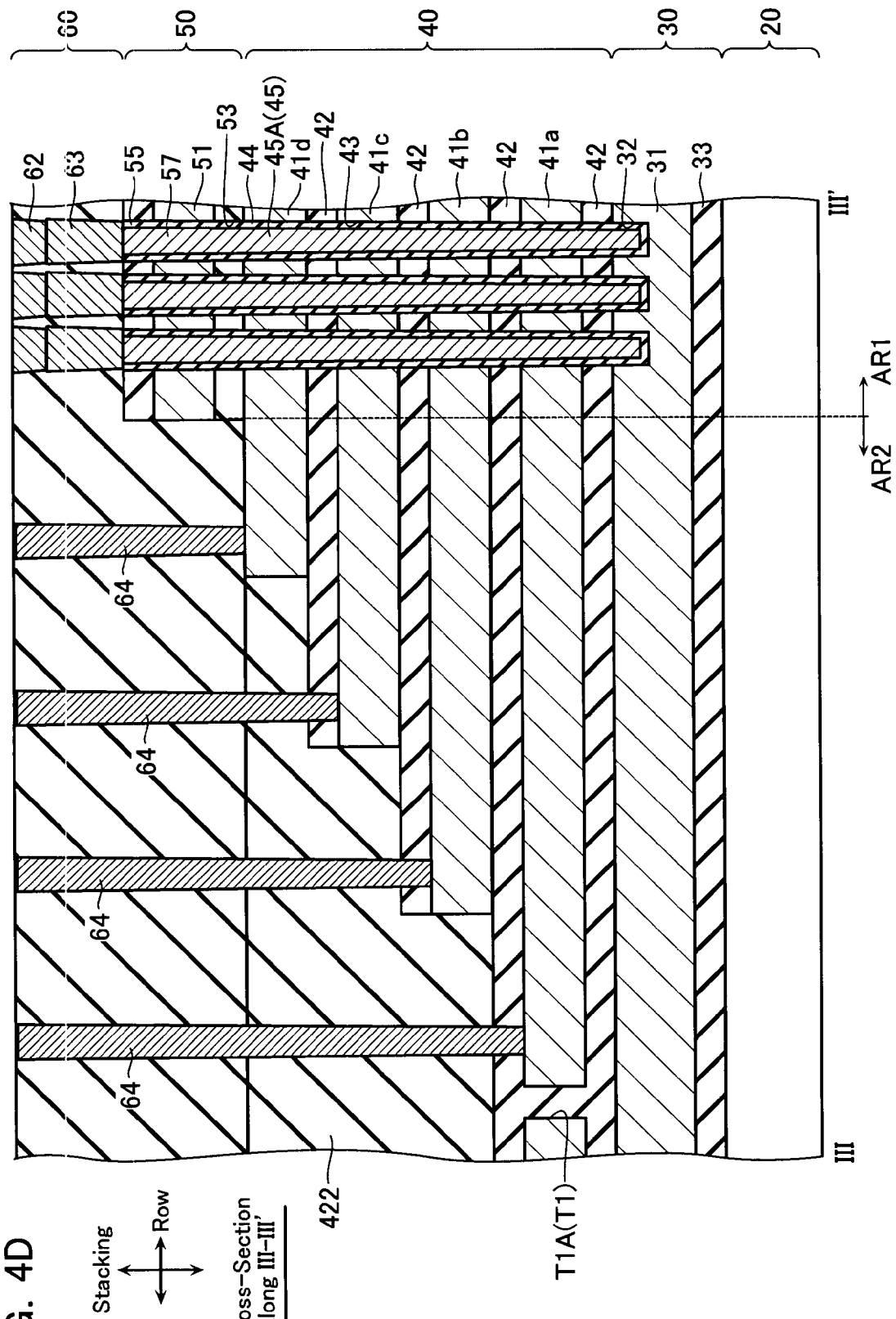
FIG. 4D is a cross-sectional view taken along the line III-III' of FIG. 4A.

Next, a stacking structure of the nonvolatile semiconductor memory device 100 in accordance with the first embodiment configured to realize the circuit configuration shown in FIG. 3 is described with reference to FIGS. 4A-4D. FIG. 4A is a schematic top view of the nonvolatile semiconductor memory device 100. FIG. 4B is a cross-sectional view taken along the line I-I' of FIG. 4A, FIG. 4C is a cross-sectional view taken along the line II-II' of FIG. 4A, and FIG. 4D is a cross-sectional view taken along the line of FIG. 4A.

As shown in FIG. 4A, the nonvolatile semiconductor memory device 100 includes a memory region AR1 having the memory transistors MTr1-MTr8 arranged therein, and a peripheral region AR2 provided in a periphery of the memory region AR1.

First, the memory region AR1 is described. As shown in FIG. 4B, the memory region AR1 of the nonvolatile semiconductor memory device 100 includes on a substrate 20, sequentially from a lower layer, a back gate layer 30, a memory transistor layer 40, a select transistor layer 50, and a wiring layer 60. The back gate transistor BTr is formed in the back gate layer 30. The memory transistors MTr1-MTr8 are formed in the memory transistor layer 40. The drain side select transistor SDTr and the source side select transistor SSTr are formed in the select transistor layer 50. The source line SL and the bit line BL are formed in the wiring layer 60.

The back gate layer 30 includes a back gate conductive layer 31 formed on the substrate 20 with an insulating layer 33 interposed therebetween, as shown in FIG. 4B. The back gate conductive layer 31 functions as the back gate line BG and as a gate of the back gate transistor BTr. The back gate conductive layer 31 is formed in a planar shape extending in the row direction and the column direction. The back gate conductive layer 31 covers a lower surface and a side surface of a joining portion 45B of a U-shaped semiconductor layer 45 to be described hereafter, and is formed to the same height as an upper surface of the joining portion 45B. The back gate conductive layer 31 is configured by polysilicon (poly-Si).

In addition, the back gate layer 30 includes a back gate hole 32 in the memory region AR1, the back gate hole 32 being formed so as to dig out the back gate conductive layer 31, as shown in FIG. 4B. The back gate hole 32 is configured as an opening having a short side in the row direction and a long side in the column direction. The back gate holes 32 are formed in a matrix at certain intervals in the row direction and the column direction.

The memory transistor layer 40 includes word line conductive layers 41a-41d in the memory region AR1, the word line conductive layers 41a-41d being stacked in the stacking direction with an insulating layer 42 interposed therebetween, as shown in FIG. 4B.

The word line conductive layers 41a-41d, as well as being stacked along the memory region AR1, are formed extending also into the peripheral region AR2, as described hereafter.

The word line conductive layers 41a-41d function as the word lines WL1-WL8 and as gates of the memory transistors MTr1-MTr8. As shown in FIG. 4A, as viewed from above, the word line conductive layers 41a-41d are formed so as to be divided in a comb shape in the memory region AR1 by a trench T1, the comb shape being configured alternately in the row direction. That is, the word line conductive layers 41a-41d are formed in stripes in the memory region AR1, the stripes extending in the row direction and having a certain pitch in the column direction. The word line conductive layers 41a-41d are configured by polysilicon (poly-Si).

The above-described trench T1 is formed so as to penetrate the word line conductive layers 41a-41d, as shown in FIG. 4A. The trench T1 has a U-shape in a plan view. The trench T1 is configured by a trench T1A, a trench T1B (first trench), and a trench T1C. The trench T1A is formed in a rectangular frame shape so as to surround the memory region AR1 and the peripheral region AR2. The trench T1B is formed in stripes in the memory region AR1 inside the trench T1A, the stripes having the row direction as a longitudinal direction and being arranged having a first pitch P1 in the column direction. The trench T1C is formed so as to alternately join one ends of pairs of trenches T1B adjacent in the column direction in the memory region AR1 inside the trench T1A.

The insulating layer 42 is formed so as to fill gaps between the word line conductive layers 41a-41d, as shown in FIG. 4B. The insulating layer 42 is configured by silicon oxide ($SiO_2$). The insulating layer 42 is formed as follows. During manufacture, a sacrifice layer is formed between the word line conductive layers 41a-41d, which sacrifice layer is removed to form an air gap, the air gap being filled in to form the insulating layer 42.

Now, it is also possible to sequentially deposit the word line conductive layers 41a-41d and an insulating layer 42A, and then form a memory hole 43 penetrating these word line conductive layers 41a-41d and insulating layer 42A. However, due to a difference in etching rates of the word line conductive layers 41a-41d and insulating layer 42A, it is difficult to form the memory hole 43 having a desired shape. Thus, in the present embodiment, first, the word line conductive layers 41a-41d and the sacrifice layer are alternately deposited and the memory hole 43 formed. Subsequently, a semiconductor layer is formed in the memory hole 43. Then, the sacrifice layer is removed and an air gap formed in the removed portion, the insulating layer 42 being formed in the air gap. A detailed method of manufacturing is described hereafter.

In addition, the memory transistor layer 40 includes the memory hole 43 formed penetrating the word line conductive layers 41a-41d and the insulating layer 42, as shown in FIG. 4B.

The memory hole 43 is formed in the memory region AR1 so as to be aligned with a position of the two end vicinities in the column direction of each back gate hole 32. The memory holes 43 are formed in a matrix with a certain pitch in the row direction and the column direction.

In addition, the above-described back gate transistor layer 30 and memory transistor layer 40 include a memory gate insulating layer 44 and the U-shaped semiconductor layer 45, as shown in FIG. 4B. The U-shaped semiconductor layer 45 functions as a body of the memory transistors MTr1-MTr8 and the back gate transistor BTr.

Figure 5A:
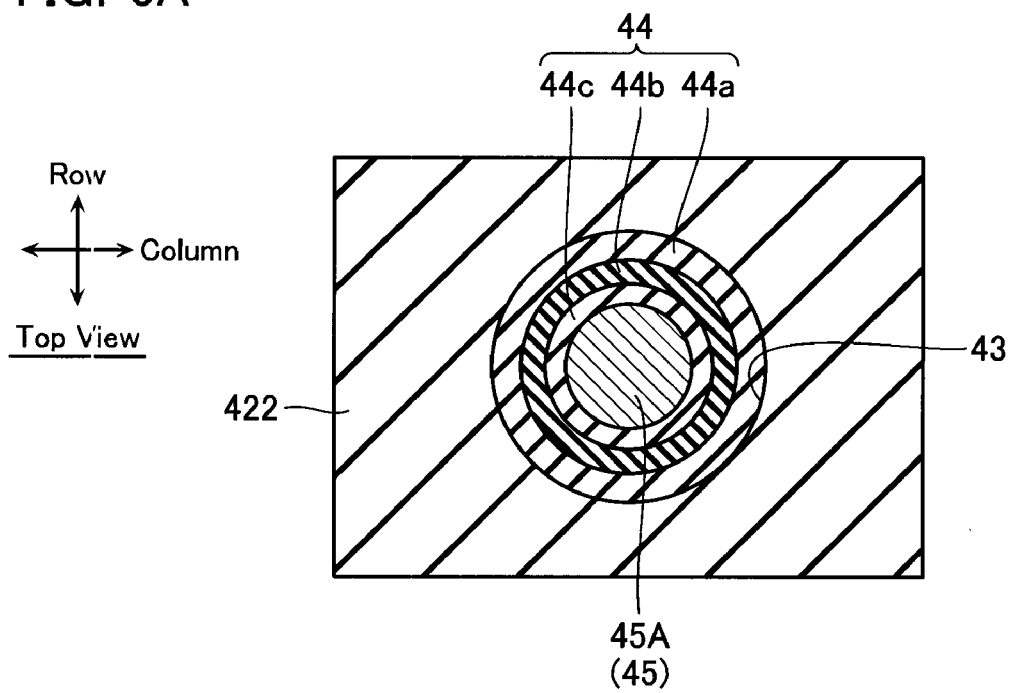
FIG. 5A is an enlarged view of FIG. 4A.
Figure 5B:
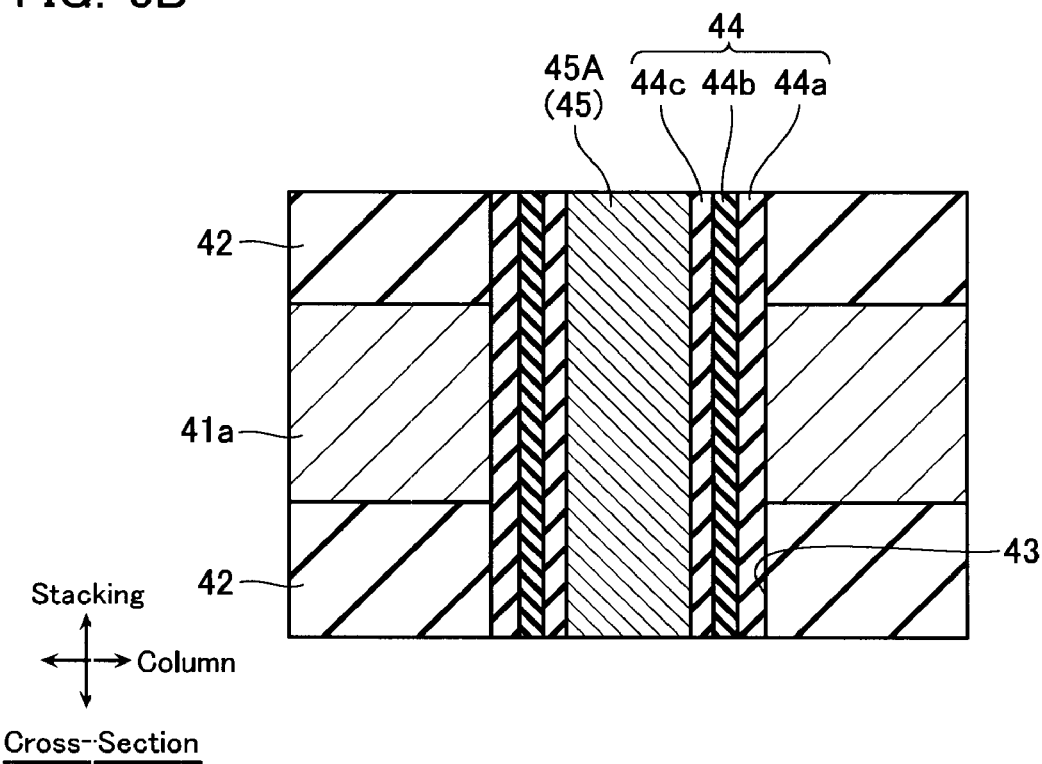
FIG. 5B is an enlarged view of FIG. 4B.

The memory gate insulating layer 44 is formed on a side surface of the memory hole 43 and the back gate hole 32, as shown in FIG. 4B. The memory gate insulating layer 44 is configured by a block insulating layer 44a, a charge storage layer 44b, and a tunnel insulating layer 44c, as shown in FIGS. 5A and 5B. The block insulating layer 44a is formed along the side surface of the memory hole 43 and the back gate hole 32 so as to be in contact with the word line conductive layers 41a-41d and the back gate conductive layer 31. The block insulating layer 44a is configured by silicon oxide (SiO$_2$). The charge storage layer 44b is formed on a side surface of the block insulating layer 44a. The charge storage layer 44b is used to store a charge, thereby retaining data of the memory transistors MTr1-MTr8. The charge storage layer 44b is configured by silicon nitride (SiN). The tunnel insulating layer 44c is formed along a side surface of the charge storage layer 44b so as to be in contact with the U-shaped semiconductor layer 45. The tunnel insulating layer 44c is configured by silicon oxide (SiO$_2$).

The U-shaped semiconductor layer 45 is formed in a U shape as viewed from the row direction, as shown in FIG. 4B. The U-shaped semiconductor layer 45 is formed so as to be in contact with the tunnel insulating layer 44c and so as to fill the back gate hole 32 and the memory hole 43, as shown in FIGS. 5A and 5B. That is, the U-shaped semiconductor layer 45 is formed in a matrix with a certain pitch in the row direction and the column direction. The U-shaped semiconductor layer 45 includes a pair of columnar portions 45A extending in a perpendicular direction with respect to the substrate 20 as viewed from the row direction, and the joining portion 45B formed so as to join lower ends of the pair of columnar portions 45A. The U-shaped semiconductor layer 45 is configured by polysilicon (poly-Si).

Expressing the above-described configuration of the memory transistor layer 40 in other words, the tunnel insulating layer 44c is formed so as to surround a side surface of the columnar portion 45A. The charge storage layer 44b is formed so as to surround a side surface of the tunnel insulating layer 44c. The block insulating layer 44a is formed so as to surround a side surface of the charge storage layer 44b. The word line conductive layers 41a-41d are formed so as to surround a side surface of the block insulating layer 44a.

The select transistor layer 50 includes a drain side conductive layer 51 and a source side conductive layer 52, the source side conductive layer 52 being formed in the same layer as the drain side conductive layer 51, as shown in FIG. 4B. The drain side conductive layer 51 functions as the drain side select gate line SGD and as a gate of the drain side select transistor SDTr. The source side conductive layer 52 functions as the source side select gate line SGS and as a gate of the source side select transistor SSTr.

The drain side conductive layer 51 and the source side conductive layer 52 are formed in stripes extending in the row direction and having a certain pitch in the column direction. The drain side conductive layer 51 and the source side conductive layer 52 are provided alternately two at a time in the column direction. The drain side conductive layer 51 and the source side conductive layer 52 are configured by polysilicon (poly-Si).

In addition, the select transistor layer 50 includes a drain side hole 53 and a source side hole 54, as shown in FIG. 4B. The drain side hole 53 is formed penetrating the drain side conductive layer 51. The source side hole 54 is formed penetrating the source side conductive layer 52. The drain side hole 53 and the source side hole 54 are formed at a position aligning with the memory hole 43.

Moreover, the select transistor layer 50 includes a drain side gate insulating layer 55, a source side gate insulating layer 56, a drain side columnar semiconductor layer 57, and a source side columnar semiconductor layer 58, as shown in FIG. 4B. The drain side columnar semiconductor layer 57 functions as a body of the drain side select transistor SDTr. The source side columnar semiconductor layer 58 functions as a body of the source side select transistor SSTr.

The drain side gate insulating layer 55 is formed on a side surface of the drain side hole 53. The source side gate insulating layer 56 is formed on a side surface of the source side hole 54. The drain side gate insulating layer 55 and the source side gate insulating layer 56 are configured by silicon oxide (SiO$_2$). The drain side columnar semiconductor layer 57 is formed in a column shape extending in the stacking direction and in contact with the drain side gate insulating layer 55, and so as to fill the drain side hole 53. The source side columnar semiconductor layer 58 is formed in a column shape extending in the stacking direction and in contact with the source side gate insulating layer 56, and so as to fill the source side hole 54. The drain side columnar semiconductor layer 57 and the source side columnar semiconductor layer 58 are configured by polysilicon (poly-Si).

Expressing the above-described configuration of the select transistor layer 50 in other words, the drain side gate insulating layer 55 is formed so as to surround a side surface of the drain side columnar semiconductor layer 57. The drain side conductive layer 51 is formed so as to surround a side surface of the drain side gate insulating layer 55. The source side gate insulating layer 56 is formed so as to surround a side surface of the source side columnar semiconductor layer 58. The source side conductive layer 52 is formed so as to surround a side surface of the source side gate insulating layer 56.

The wiring layer 60 includes a first wiring layer 61, a second wiring layer 62, and a plug layer 63, as shown in FIG. 4B. The first wiring layer 61 functions as the source line SL. The second wiring layer 62 functions as the bit line BL.

The first wiring layer 61 is formed so as to be commonly in contact with upper surfaces of adjacent two of the source side columnar semiconductor layers 58, as shown in FIG. 4B. The first wiring layer 61 is formed in stripes extending in the row direction and having a certain pitch in the column direction. The first wiring layer 61 is configured by a metal such as tungsten (W).

The second wiring layer 62 is connected to an upper surface of the drain side columnar semiconductor layer 57 via the plug layer 63, as shown in FIG. 4B. The second wiring layer 62 is formed in stripes extending in the column direction and having a certain pitch in the row direction. The second wiring layer 62 and the plug layer 63 are configured by a metal such as tungsten (W).

Next, the peripheral region AR2 is described. As shown in FIG. 4D, the peripheral region AR2 of the nonvolatile semiconductor memory device 100 in accordance with the first embodiment includes the word line conductive layers 41a-41d and the insulating layer extending from the memory region AR1, and an insulating layer 422.

The word line conductive layers 41a-41d in the peripheral region AR2 are formed in a plate shape extending in the row direction and the column direction, as shown in FIG. 4A. The word line conductive layers 41a-41d in the peripheral region AR2 include a stepped portion ST, as shown in FIG. 4A. The stepped portion ST is formed in a stepped shape such that positions of ends of the word line conductive layers 41a-41d differ, thereby enabling connection of a contact plug layer 64 to be described hereafter.

Furthermore, the word line conductive layers 41a-41d in the peripheral region AR2 include trenches T2 (second trenches) and trenches T3 (third trenches), as shown in FIG. 4A. The trenches T2 and T3 are formed penetrating the word line conductive layers 41a-41d. The trenches T2 are formed in stripes having the row direction as a longitudinal direction and having a second pitch P2 in the column direction. The trenches T3 are formed in stripes having the row direction as a longitudinal direction and having the second pitch P2 (P2>P1) in the column direction and so as to be sandwiched by the trenches T2. The trenches T2 and T3 are formed alternately in the column direction with the first pitch P1 (P1=P2/2). A length in the row direction of the trench T2 is greater than a length in the row direction of the trench T3.

The insulating layer 42 in the peripheral region AR2 is formed continuously from the memory region AR1, as shown in FIG. 4D. The trenches T1 and T2 in the peripheral region AR2 are filled by this insulating layer 42, as shown in FIG. 4C. In contrast, the trench T3 is filled by an insulating layer 421. The insulating layer 421 is configured by silicon oxide ($SiO_2$) and is formed in a separate process to the insulating layer 42. Portions of the insulating layers 42 and 421 are formed in a region sandwiched by the word line conductive layers 41a-41d in the perpendicular direction with respect to the substrate 20. A boundary line between the portions of the insulating layers 42 and 421 is generally perpendicular to the substrate 20.

The insulating layer 422 is formed so as to fill the word line conductive layers 41a-41d and the insulating layer 42 (stepped portion ST), as shown in FIG. 4D. The insulating layer 422 is configured by silicon oxide ($SiO_2$).

Moreover, the peripheral region AR2 of the nonvolatile semiconductor memory device 100 in accordance with the first embodiment includes the contact plug layer 64. The contact plug layer 64 is formed to electrically connect wiring in a layer above (not shown) and the word line conductive layers 41a-41d configuring the stepped portion ST. The contact plug layer 64 is formed in a column shape extending in the stacking direction and is formed having its lower surface in contact with an upper surface of the word line conductive layers 41a-41d. The contact plug layer 64 is configured by a metal such as tungsten (W).

[Method of Manufacturing Nonvolatile Semiconductor Memory Device in accordance with First Embodiment]

Next, a method of manufacturing the nonvolatile semiconductor memory device in accordance with the first embodiment is described with reference to FIGS. 6A-14. FIGS. 6A-14 are views showing manufacturing processes of the nonvolatile semiconductor memory device in accordance with the first embodiment.

Figure 6B:
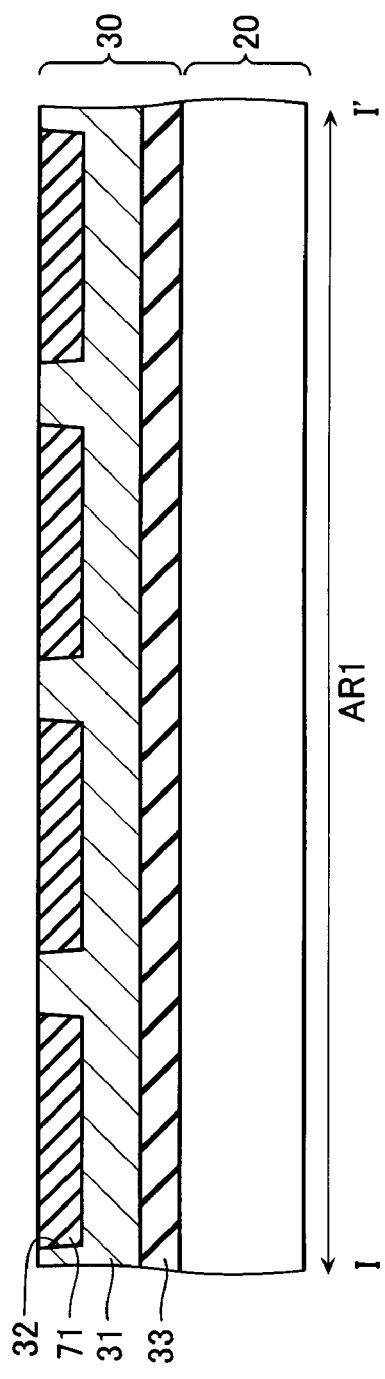
FIG. 6B is a cross-sectional view taken along the line I-I' of FIG. 6A.

First, silicon oxide ($SiO_2$) and polysilicon (poly-Si) are deposited in the memory region AR1 and the peripheral region AR2 of the substrate 20 to form the insulating layer 33 and the back gate conductive layer 31, as shown in FIGS. 6A and 6B. Then, the back gate layer 31 in the memory region AR1 is dug out to a certain depth to form the back gate hole 32. Next, silicon nitride (SiN) is deposited to fill the back gate hole 32, thereby forming a sacrifice layer 71.

Figure 7A:
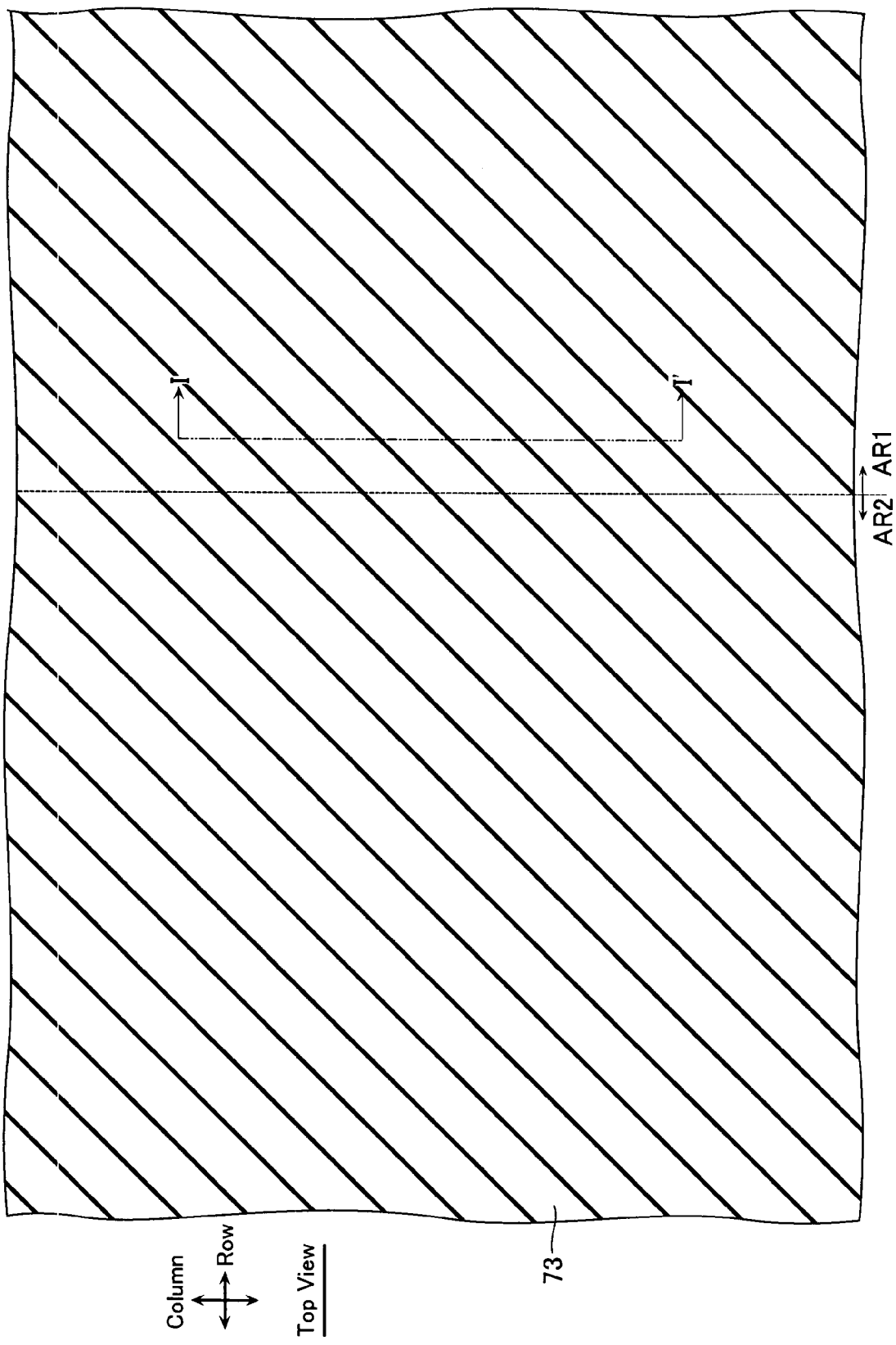
FIG. 7A is a top view showing a manufacturing process of the nonvolatile semiconductor memory device 100 in accordance with the first embodiment.

Subsequently, LPCVD (Low Pressure Chemical Vapor Deposition) is used to form sacrifice layers 72a-72d and the word line conductive layers 41a-41d alternately on an upper portion of the back gate conductive layer 31 and sacrifice layer 71, as shown in FIGS. 7A and 7B. The LPCVD alternately uses silane ($SiH_4$) gas and a mixed gas of silane and boron trichloride ($BCl_3$). As a result, the sacrifice layers 72a-72d are configured by non-doped amorphous silicon that does not include boron (impurity), and the word line conductive layers 41a-41d are configured by amorphous silicon that does include boron (impurity).

Next, silicon oxide ($SiO_2$) is deposited to form an insulating layer 73 acting as a mask, as shown in FIGS. 7A and 7B.

Figure 8A:
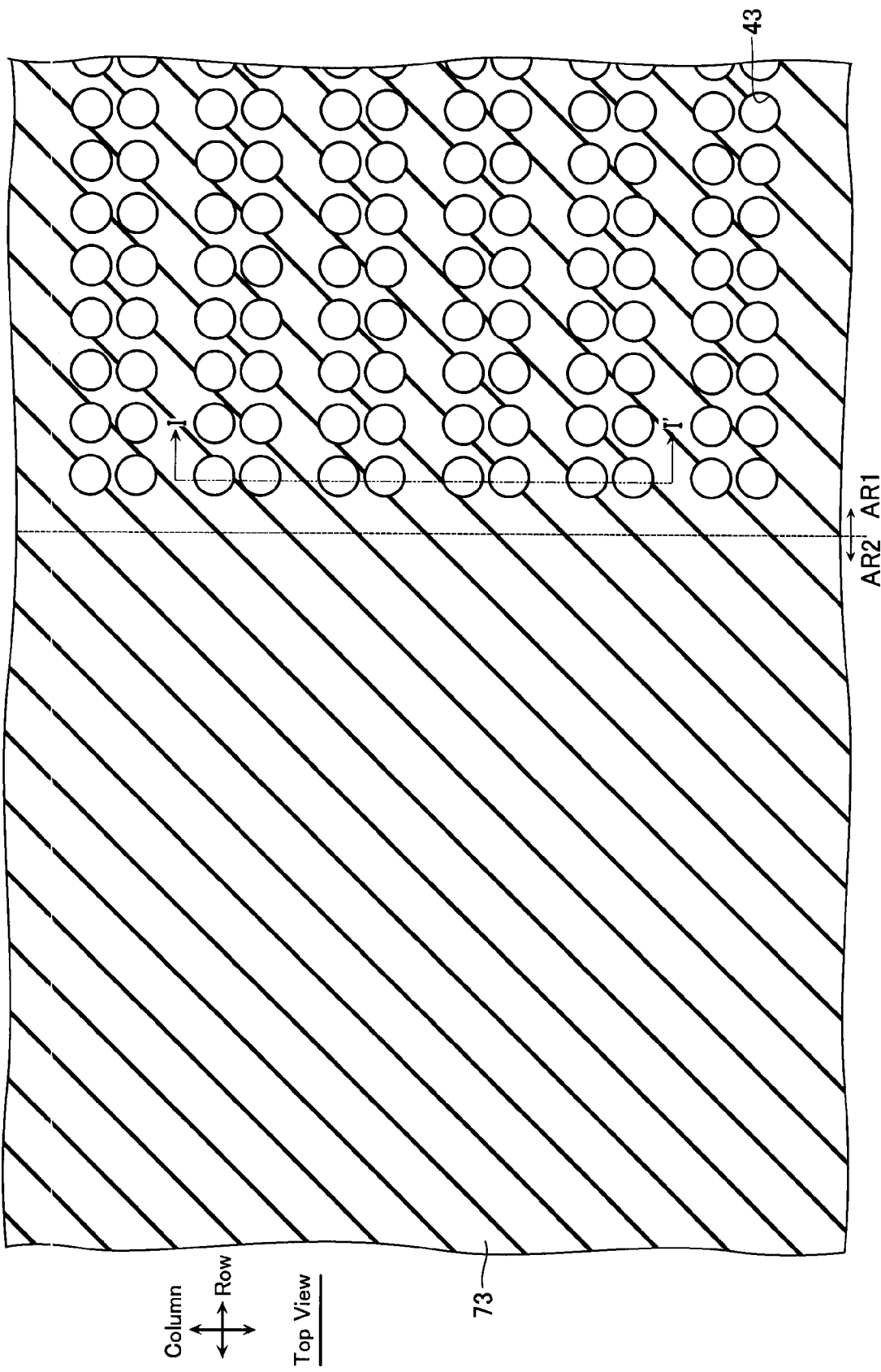
FIG. 8A is a top view showing a manufacturing process of the nonvolatile semiconductor memory device 100 in accordance with the first embodiment.
Figure 8B:
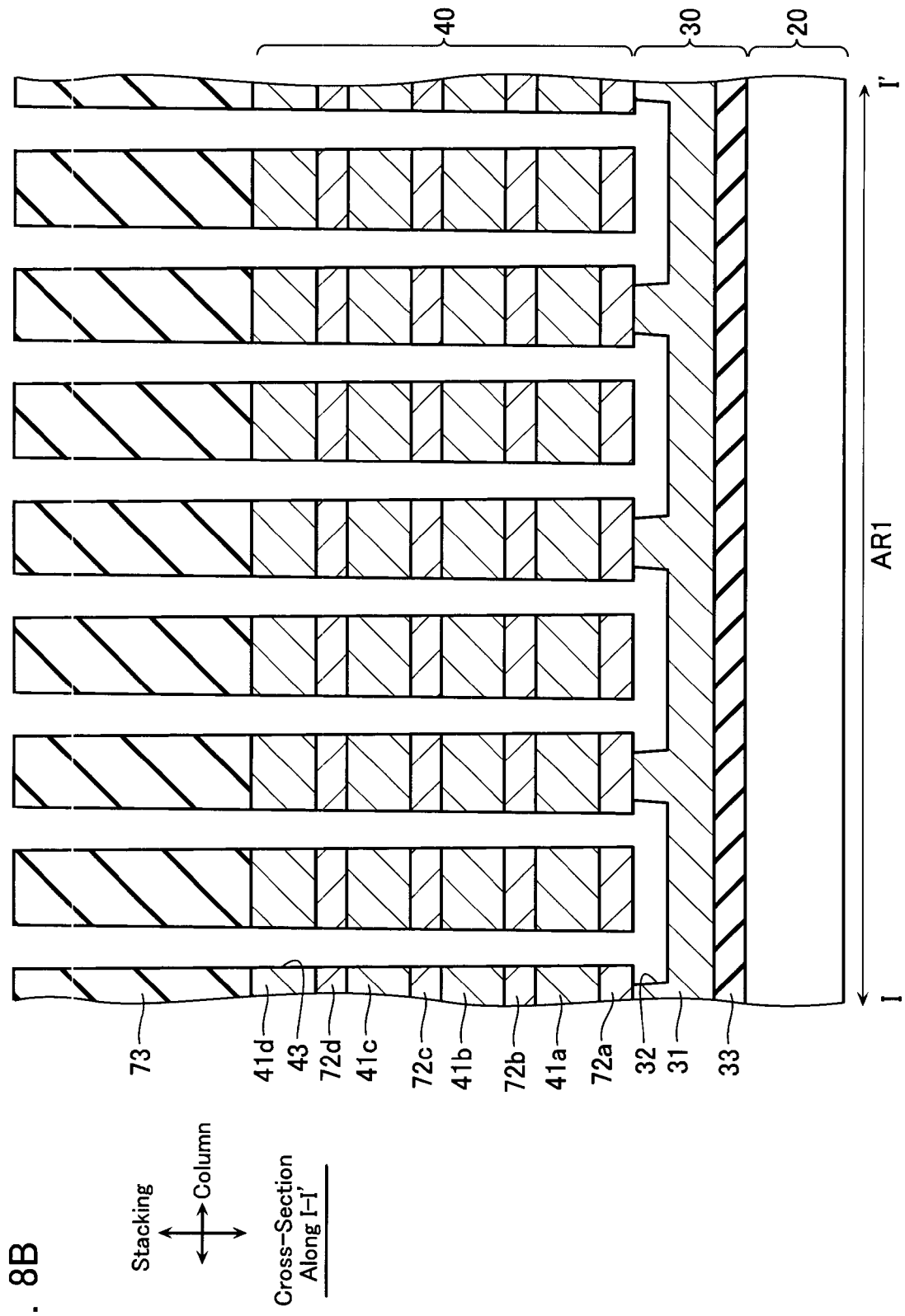
FIG. 8B is a cross-sectional view taken along the line I-I' of FIG. 8A.

Then, the memory hole 43 is formed in the memory region AR1 so as to penetrate the word line conductive layers 41a-41d and the sacrifice layers 72a-72d, as shown in FIGS. 8A and 8B. The memory holes 43 are formed in a matrix to have a certain pitch in the row direction and the column direction. In addition, the memory hole 43 is formed at a position aligning with the two ends in the column direction of the back gate hole 32. Next, the sacrifice layer 71 is removed via the memory hole 43.

Subsequently, silicon oxide ($SiO_2$), silicon nitride (SiN), and silicon oxide ($SiO_2$) are sequentially deposited on a side surface facing the memory hole 43 and the back gate hole 32, thereby forming the memory gate insulating layer 44, as shown in FIGS. 9A and 9B. Next, polysilicon (poly-Si) is deposited so as to fill the memory hole 43 and the back gate hole 32, thereby forming the U-shaped semiconductor layer 45.

Figure 10B:
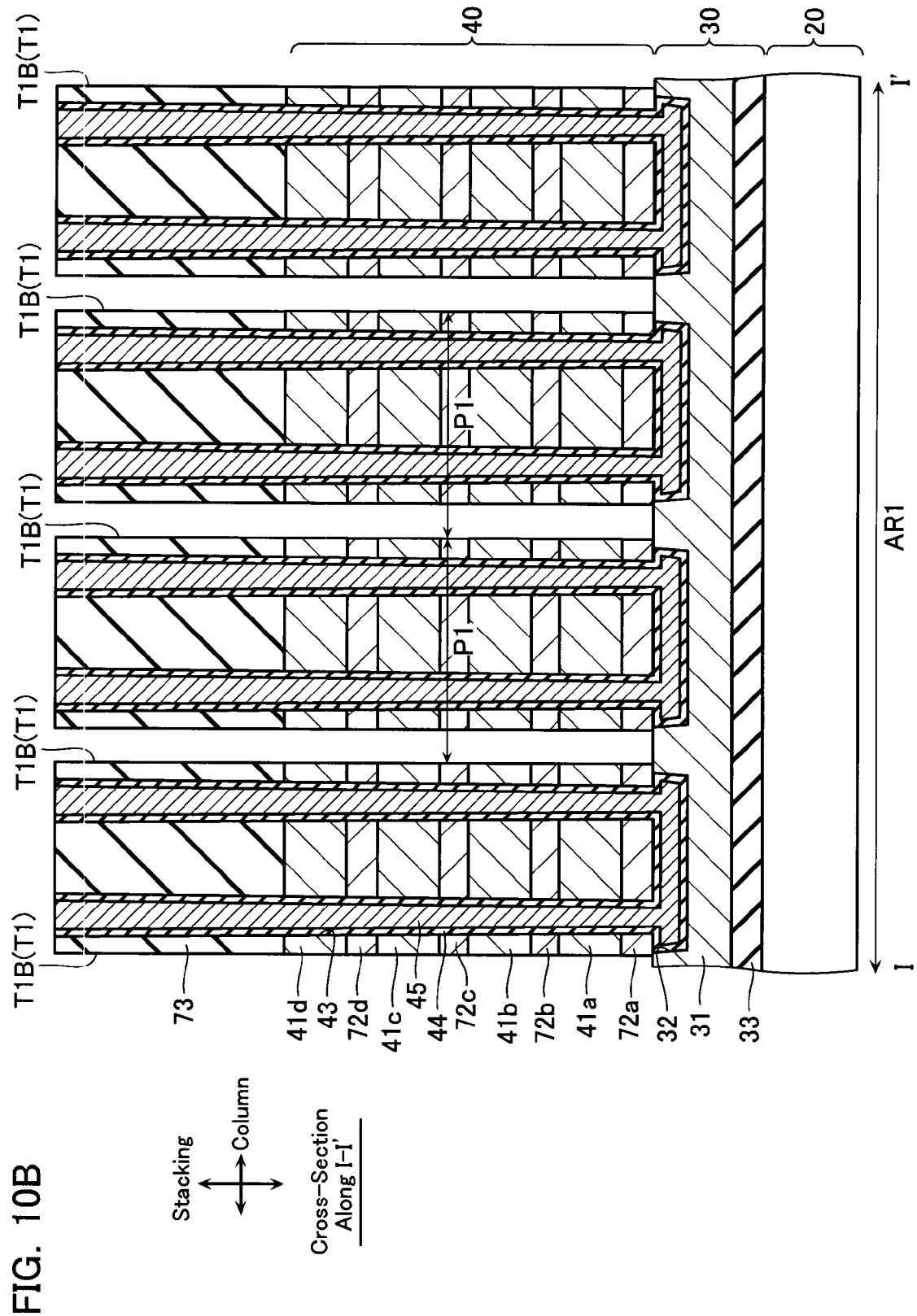
FIG. 10B is a cross-sectional view taken along the line I-I' of FIG. 10A.
Figure 10C:
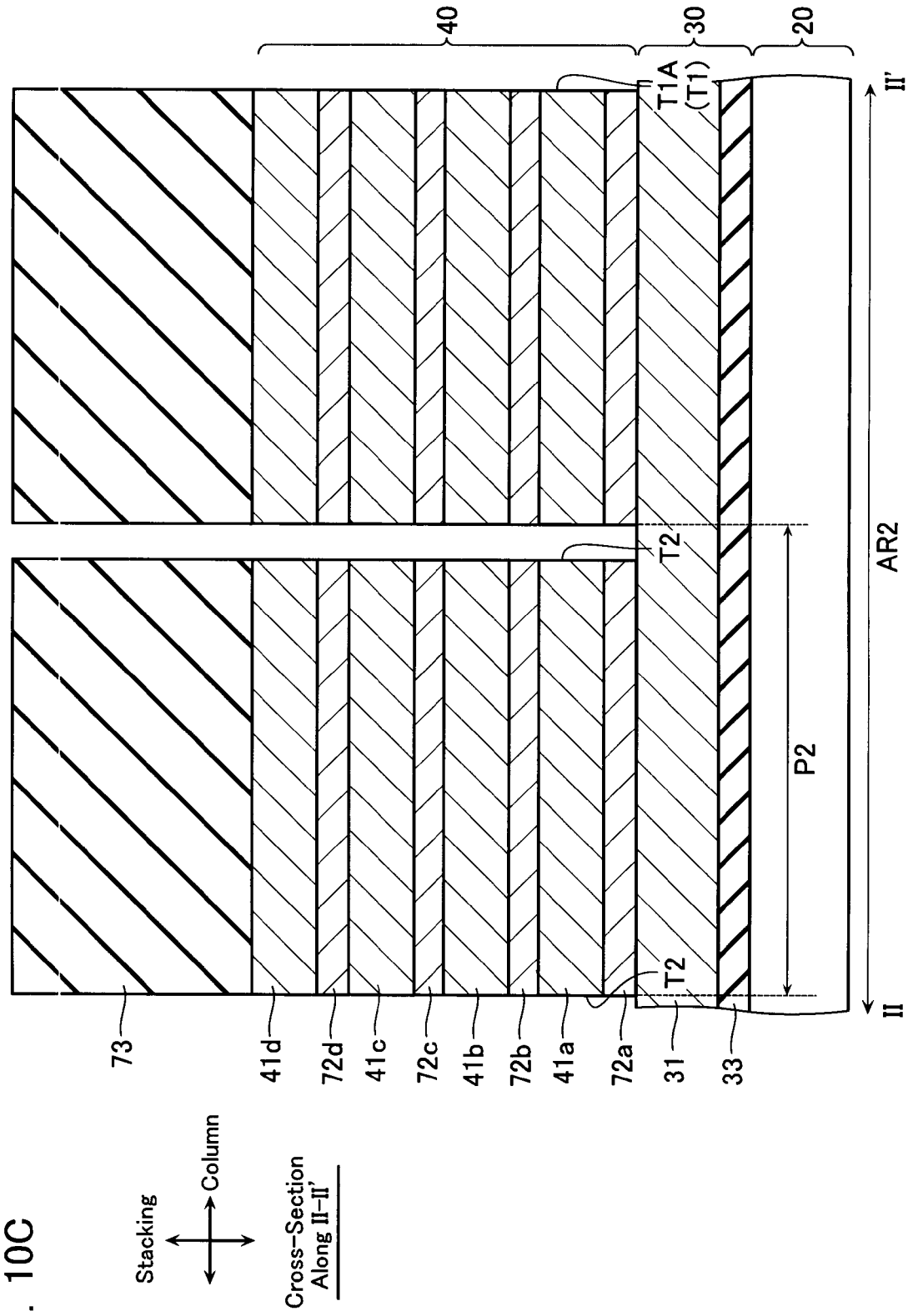
FIG. 10C is a cross-sectional view taken along the line II-II' of FIG. 10A.

Next, the trenches T1 and T2 are formed, as shown in FIGS. 10A-10C. The trenches T1 and T2 are formed so as to penetrate the word line conductive layers 41a-41d, the sacrifice layers 72a-72d, and the insulating layer 73.

The trench T1 is formed dividing the word line conductive layers 41a-41d in a comb shape. The trench T1 is formed so as to include the trench T1A, the trench T1B, and the trench T1C. The trench T1A is formed in a rectangular frame shape so as to surround the memory region AR1 and the peripheral region AR2. The trench T1B is formed in stripes in the memory region AR1 inside the trench T1A, the stripes having the row direction as a longitudinal direction and being arranged having the first pitch P1 in the column direction. The trench T1C is formed so as to alternately join one ends of pairs of trenches T1B adjacent in the column direction in the memory region AR1 inside the trench T1A.

The trenches T2 are formed having the second pitch P2 in the column direction, and are formed in stripes having the row direction as a longitudinal direction.

Figure 11A:
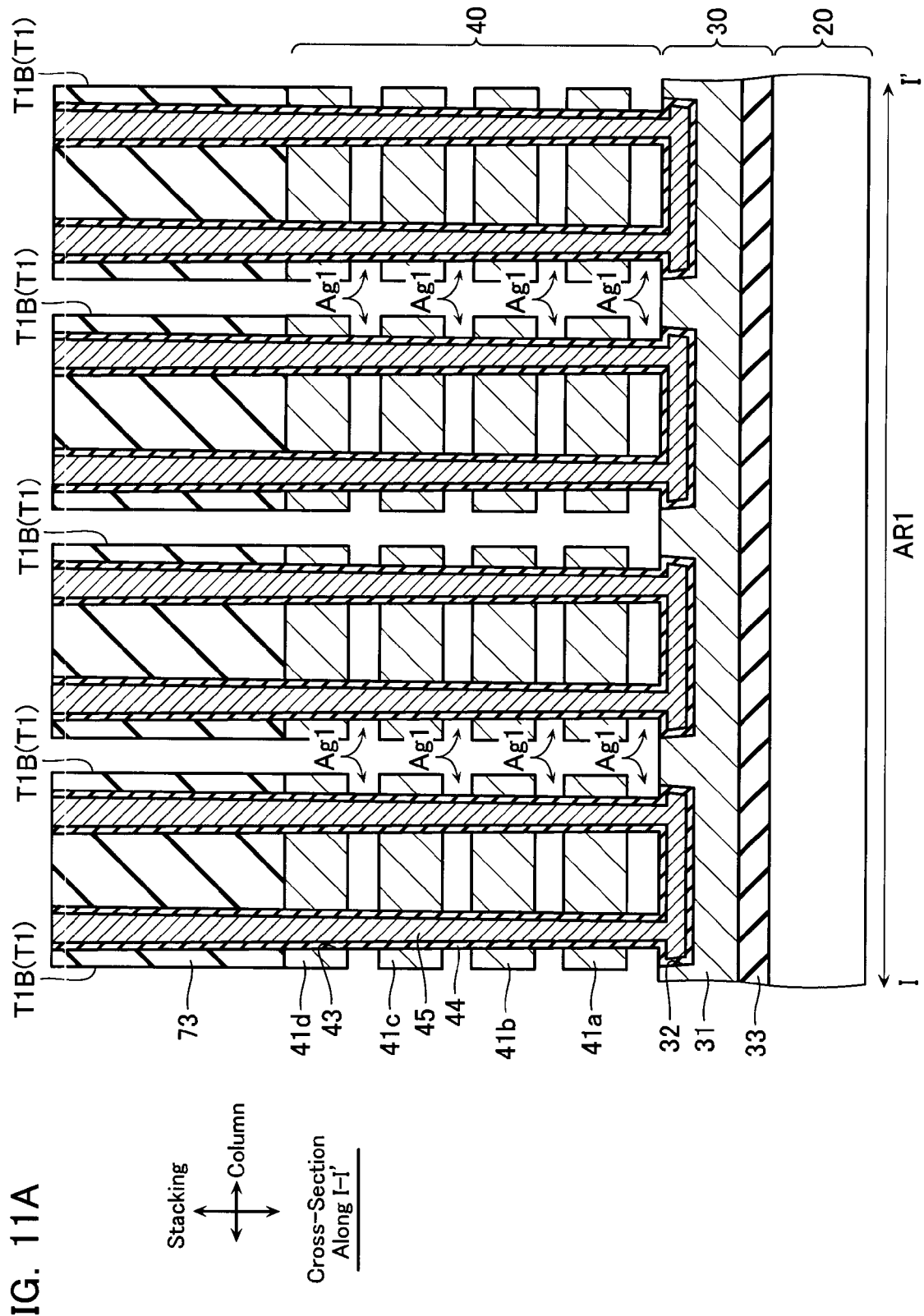
FIG. 11A is a cross-sectional view taken along the line I-I' of FIG. 10A.
Figure 11B:
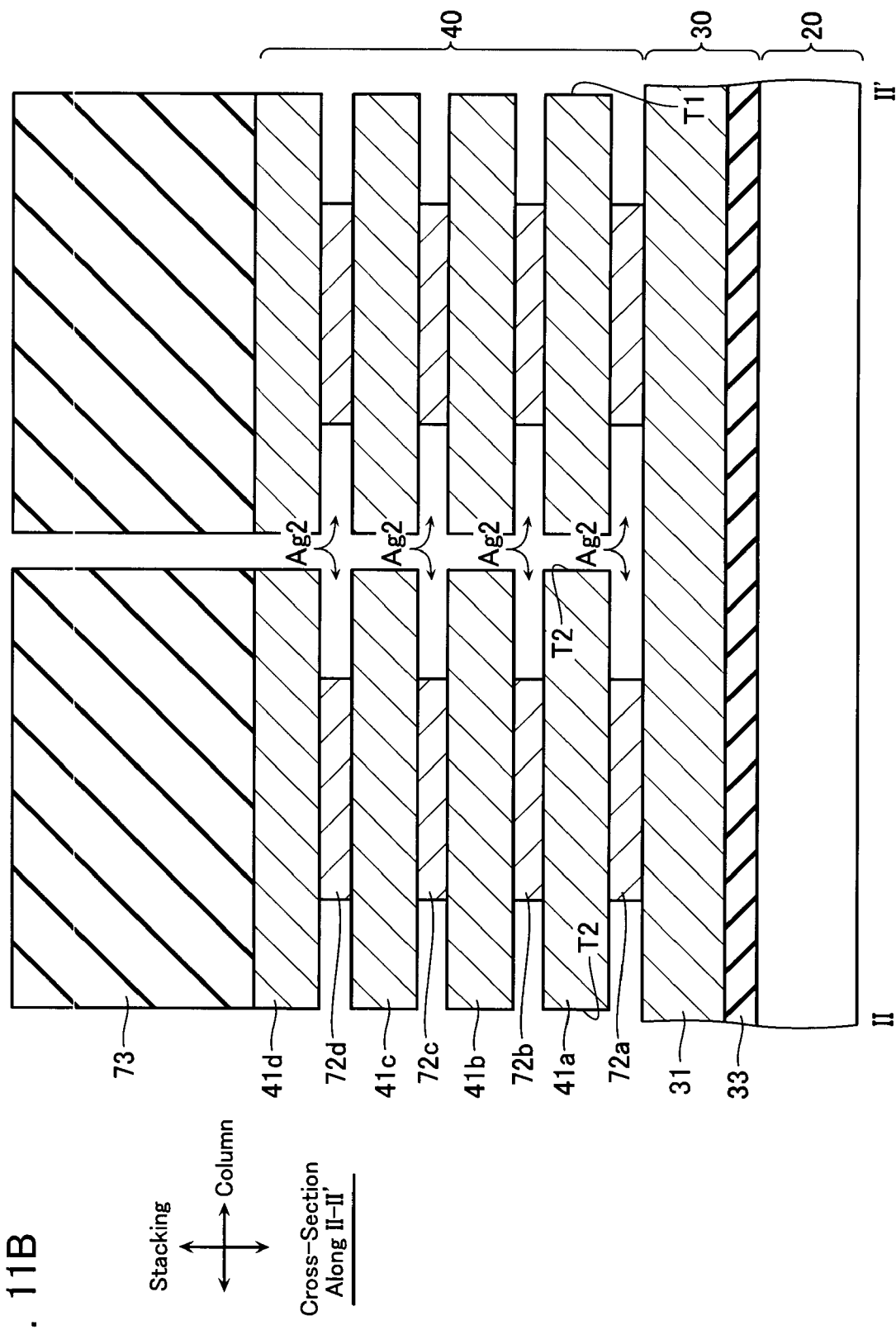
FIG. 11B is a cross-sectional view taken along the line II-II' of FIG. 10A.

Then, the sacrifice layers 72a-72d in the memory region AR1 are removed via the trench T1 to form an air gap Ag1 in the removed portion, as shown in FIGS. 11A and 11B. At the same time, side surfaces of the sacrifice layers 72a-72d in the peripheral region AR2 facing the trenches T2 are cut back (recessed) to form an air gap Ag2 in the cut back portion.

Now, in the memory region AR1, the sacrifice layers 72a-72d are completely removed. That is, the word line conductive layers 41a-41d become supported by the U-shaped semiconductor layer 45. Furthermore, the trench T2 is formed with a greater separation than the trench T1, and the sacrifice layers 72a-72d in the peripheral region AR2 have only their side surface removed. That is, the word line conductive layers 41a-41d become supported by a remaining portion of the sacrifice layers 72a-72d.

Figure 12A:
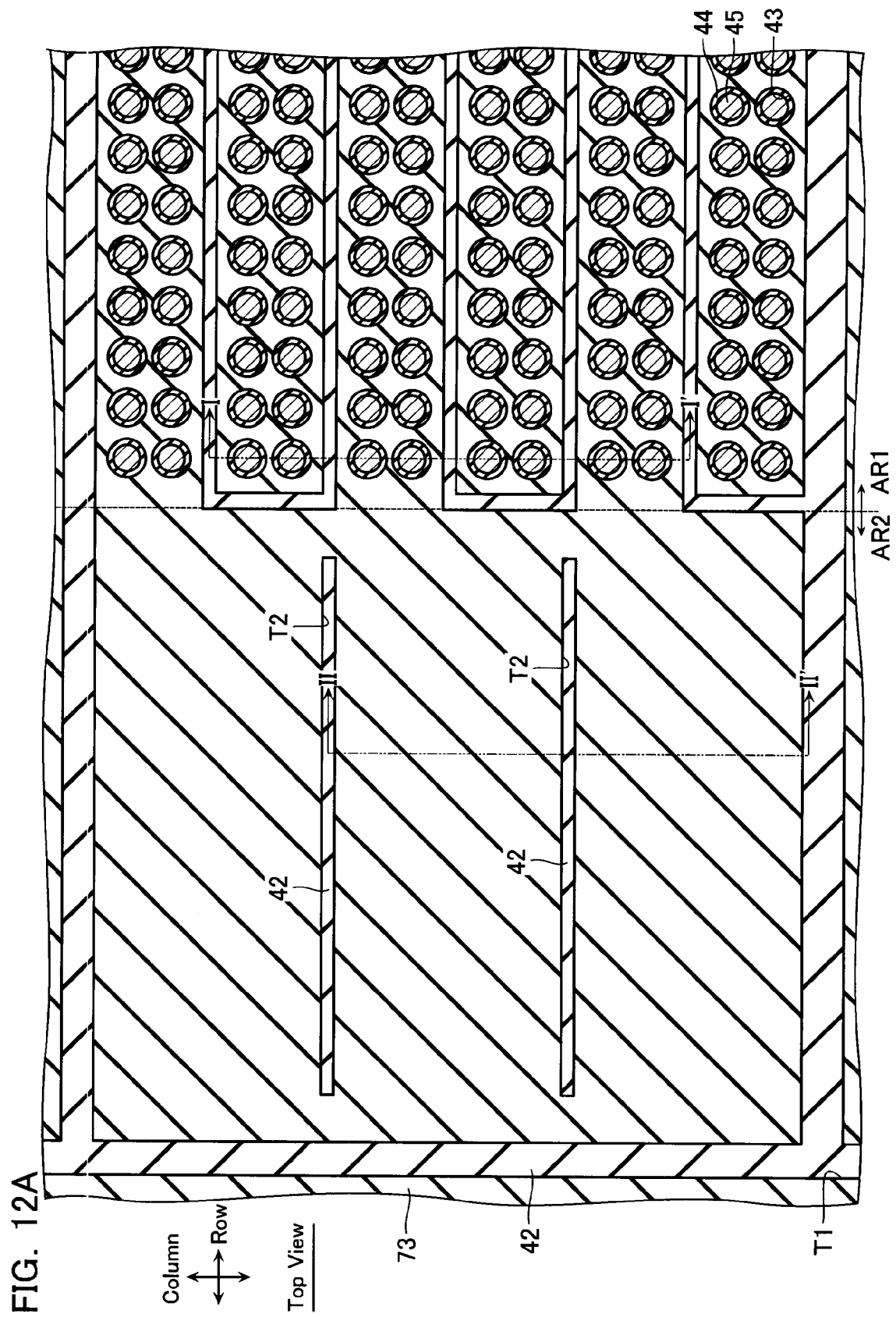
FIG. 12A is a top view showing a manufacturing process of the nonvolatile semiconductor memory device 100 in accordance with the first embodiment.
Figure 12B:
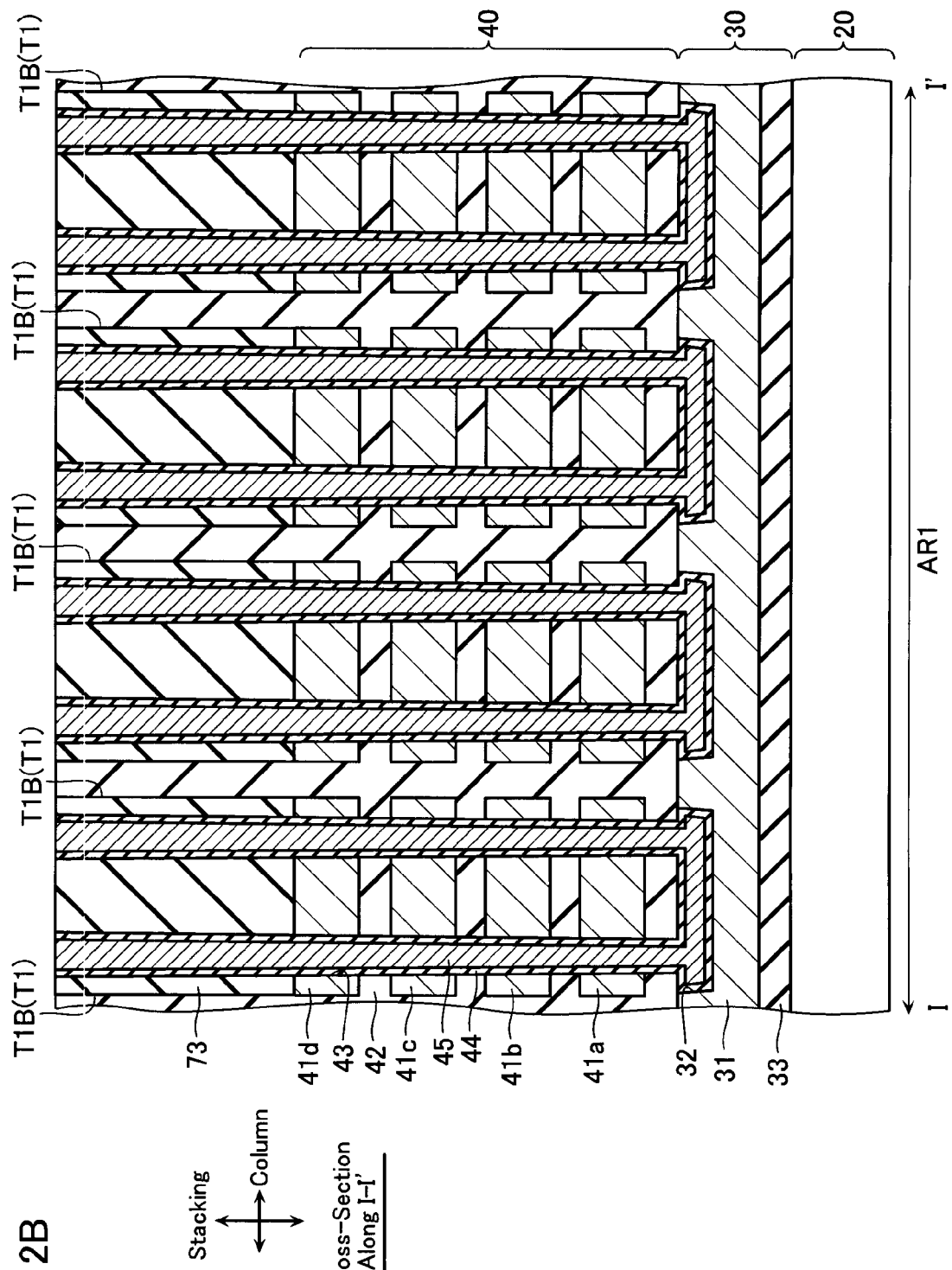
FIG. 12B is a cross-sectional view taken along the line I-I' of FIG. 12A.
Figure 12C:
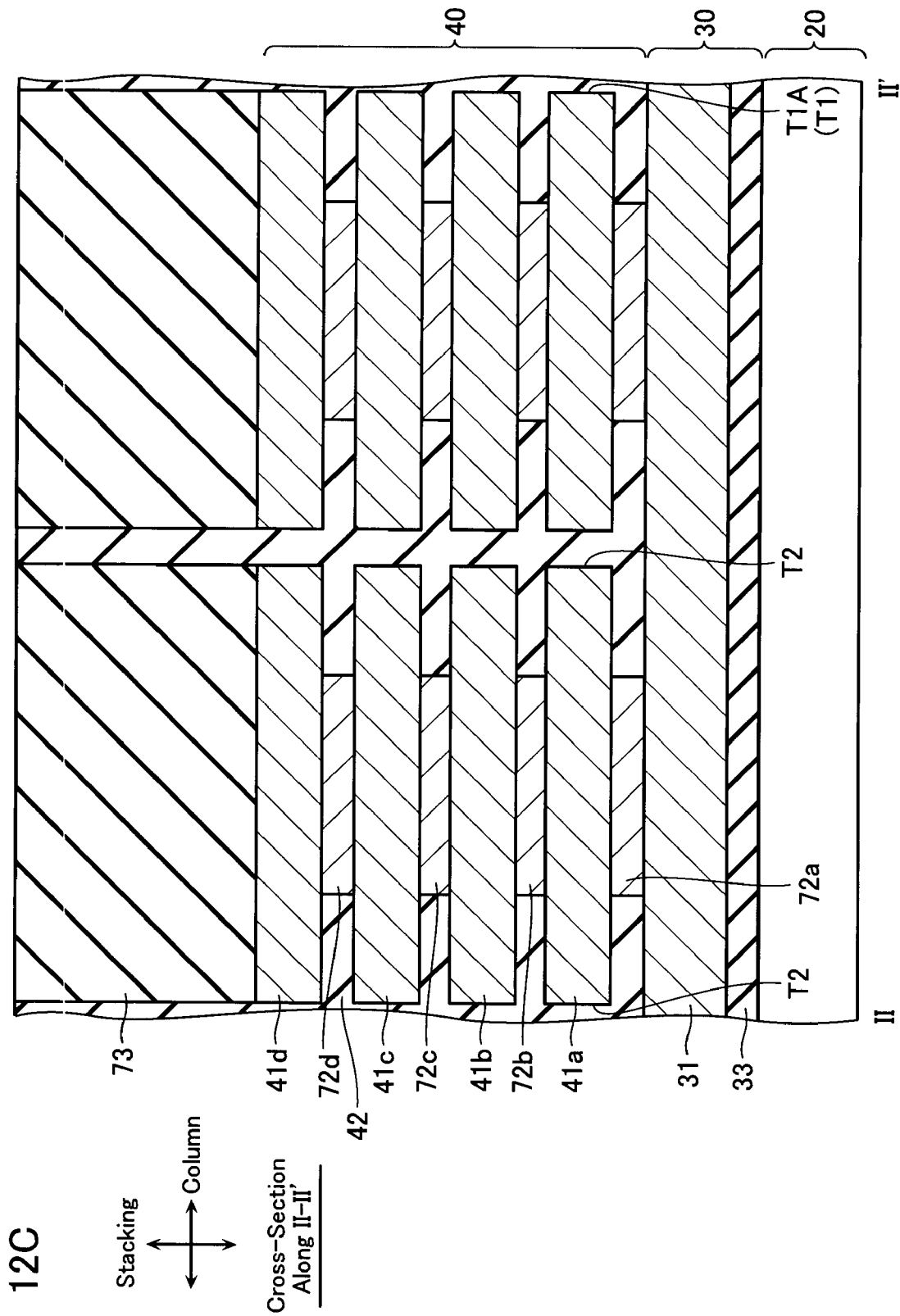
FIG. 12C is a cross-sectional view taken along the line II-II' of FIG. 12A.

Next, silicon oxide ($SiO_2$) is deposited so as to fill the trenches T1 and T2, and the air gaps Ag1 and Ag2, thereby forming the insulating layer 42, as shown in FIGS. 12A-12C.

Figure 13A:
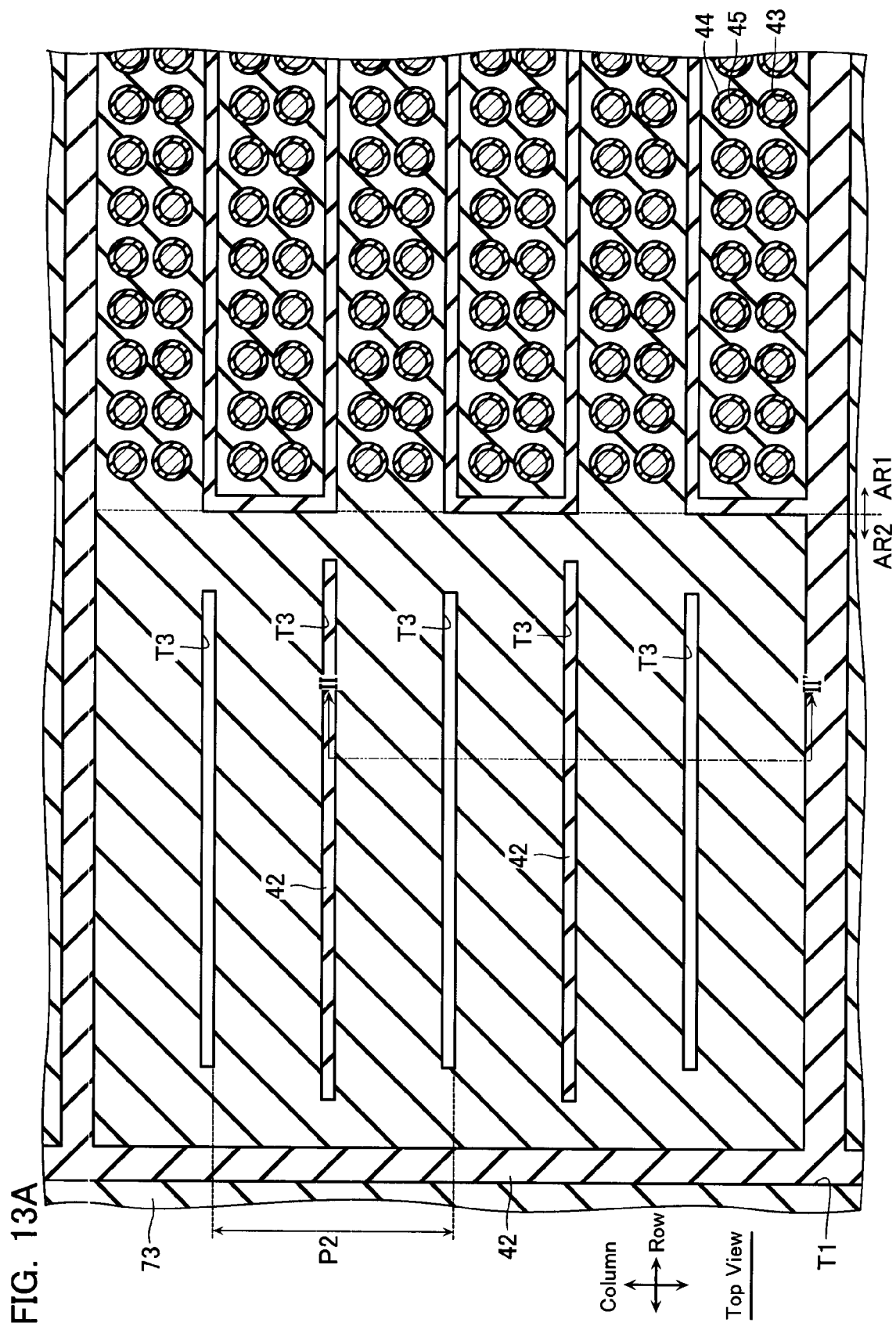
FIG. 13A is a top view showing a manufacturing process of the nonvolatile semiconductor memory device 100 in accordance with the first embodiment.
Figure 13B:
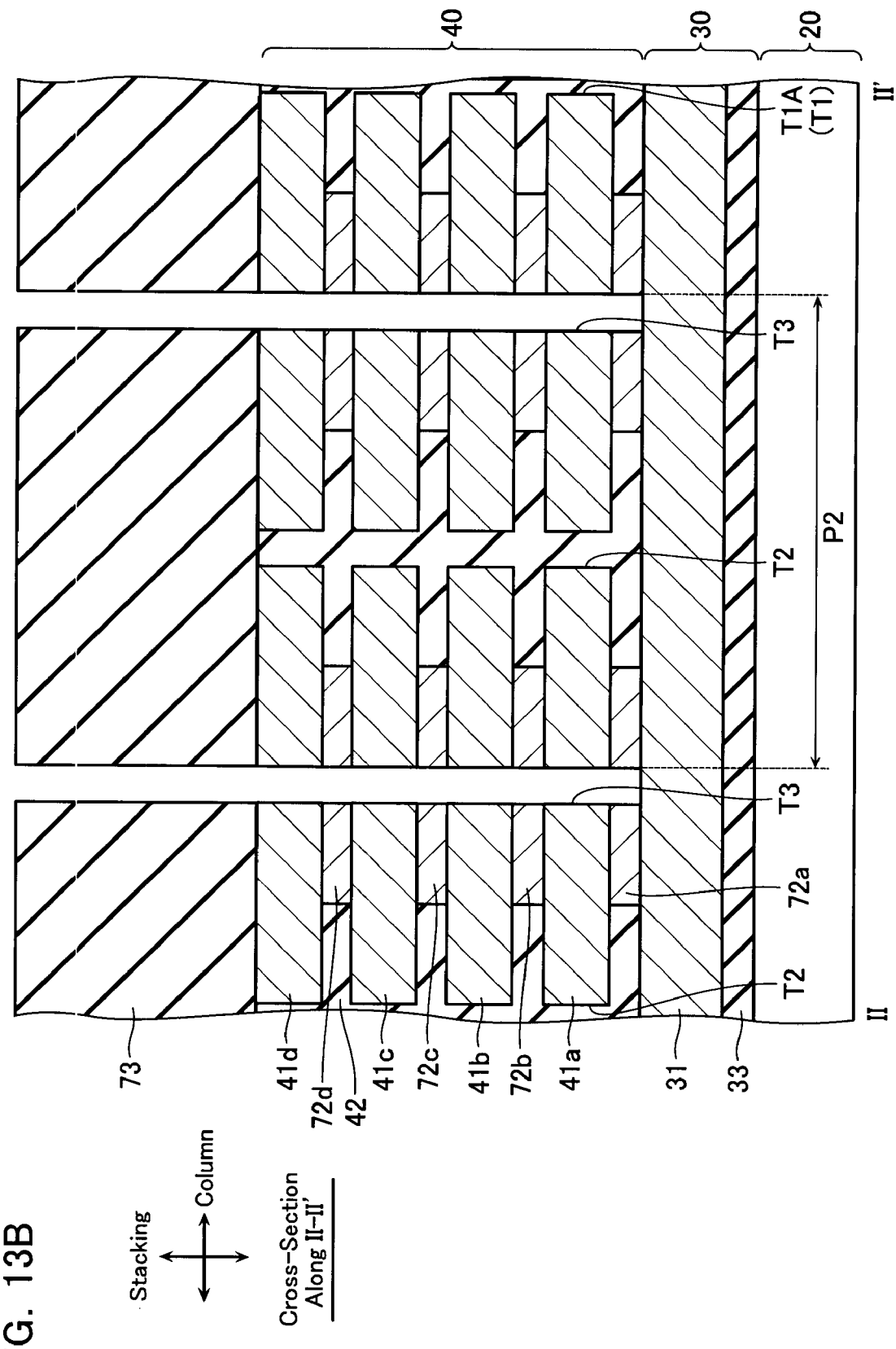
FIG. 13B is a cross-sectional view taken along the line II-II' of FIG. 13A.

Then, the trenches T3 are formed in the peripheral region AR2 between the trenches T2 aligned in the column direction, as shown in FIGS. 13A and 13B. The trench T3 is formed penetrating the word line conductive layers 41a-41d and the remaining portion of the sacrifice layers 72a-72d. The trenches T3 are formed in stripes having the row direction as a longitudinal direction and having the second pitch P2 in the column direction and so as to be sandwiched by the trenches T2.

Figure 14:
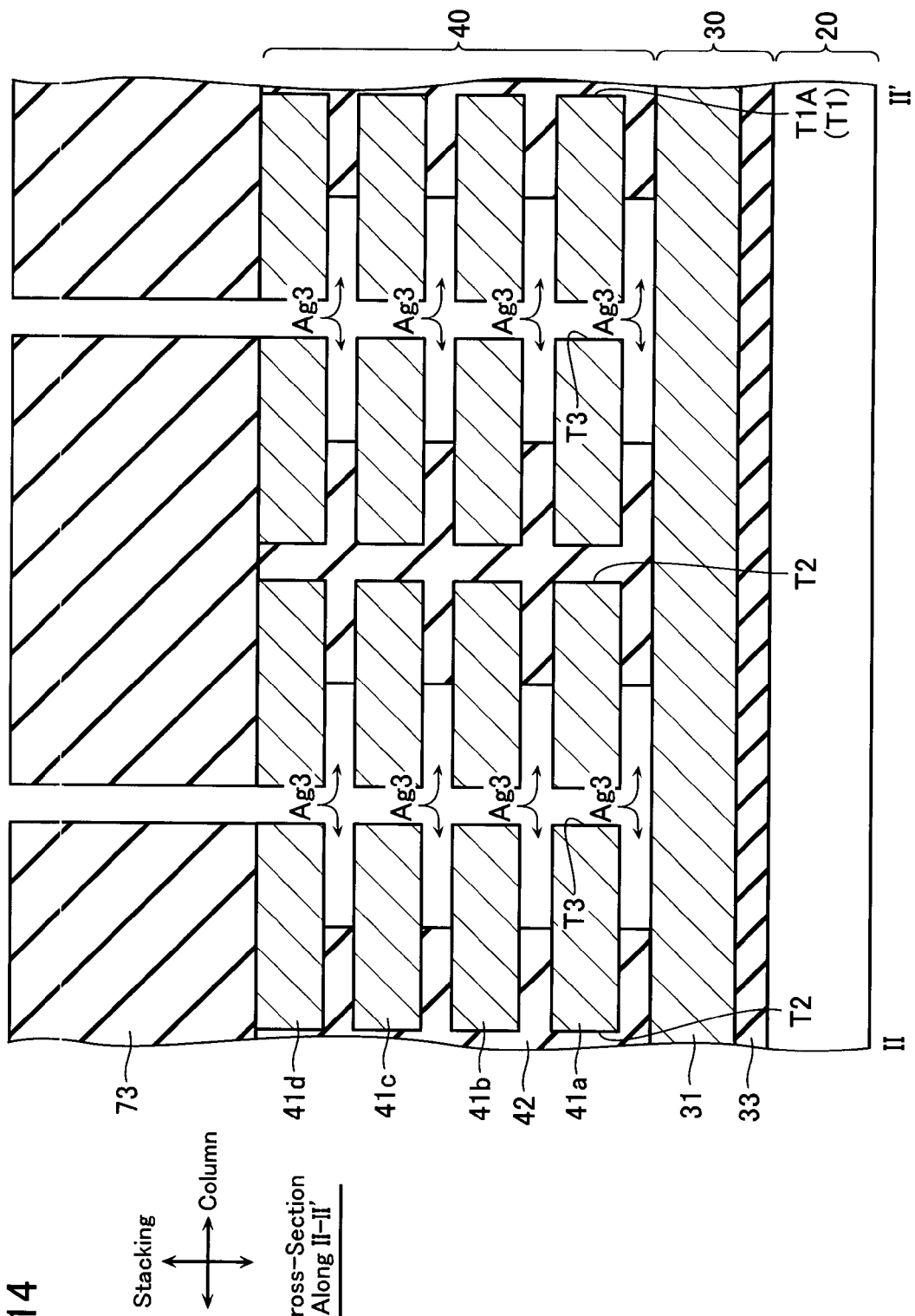
FIG. 14 is a cross-sectional view taken along the line II-II' of FIG. 13A.

Next, the remaining portion of the sacrifice layers 72a-72d is removed via the trench T3 to form an air gap Ag3 in the removed portion, as shown in FIG. 14. Now, on formation of the air gap Ag3, the word line conductive layers 41a-41d are supported by the insulating layer 42.

Subsequent to the process shown in FIG. 14, silicon oxide ($SiO_2$) is deposited to fill the trench T3 and the air gap Ag3, thereby forming the insulating layer 421. Additionally, subsequent to the process shown in FIG. 14, the word line conductive layers 41a-41d in the peripheral region AR2 are processed in a stepped shape to form the stepped portion ST. Then, silicon oxide (SiO$_2$) is deposited to fill the stepped portion ST, thereby forming the insulating layer 422.

In the method of manufacturing the nonvolatile semiconductor memory device 100 in accordance with the first embodiment, the word line conductive layers 41a-41d and the sacrifice layers 72a-72d are both configured by amorphous silicon. The word line conductive layers 41a-41d and the sacrifice layers 72a-72d can thus be formed continuously using a single depositing device, thereby increasing yield.

A comparative example is here considered in which the word line conductive layers 41a-41d are configured by amorphous silicon and sacrifice layers are configured by silicon oxide. In the case of this comparative example, etching rates of the word line conductive layers 41a-41d and the sacrifice layers differ greatly. It is thus difficult in the comparative example to form the memory hole 43 in one industrial manufacturing step so as to penetrate the word line conductive layers 41a-41d and the sacrifice layers. In contrast, in the above-described first embodiment, the word line conductive layers 41a-41d and the sacrifice layers 72a-72d are both configured by amorphous silicon, and the etching rates are substantially the same. The memory hole 43 can thus be formed in one industrial manufacturing step so as to penetrate the word line conductive layers 41a-41d and the sacrifice layers 72a-72d.

Furthermore, in order to fill between the word line conductive layers 41a-41d with the insulating layer 42 in the memory region AR1, the sacrifice layers 72a-72d in the memory region AR1 are removed in a state where the U-shaped semiconductor layer 45 is provided, thereby forming the air gap Ag1 in the removed portion. The insulating layer 42 is then formed filling the air gap Ag1. As a result, even when the air gap Ag1 is formed, the support of the U-shaped semiconductor layer 45 prevents collapse or sagging of the structure of the word line conductive layers 41a-41d in the memory region AR1.

Moreover, in order to fill between the word line conductive layers 41a-41d with the insulating layer 42 in the peripheral region AR2 (stepped portion ST), the air gap Ag2 is formed so as to leave a part of the sacrifice layers 72a-72d in the peripheral region AR2 (stepped portion ST). Now, in order to leave a part of the sacrifice layers 72a-72d, the trenches T2 are formed having the second pitch P2 (P2>P1) in the column direction. The insulating layer 42 is then formed filling the air gap Ag2. Next, the remaining portion of the sacrifice layers 72a-72d is removed to form the air gap Ag3. The insulating layer 421 is then formed filling the air gap Ag3. As a result, even when the air gap Ag2 is formed, the support of the remaining portion of the sacrifice layers 72a-72d prevents collapse or sagging of the structure of the word line conductive layers 41a-41d in the peripheral region AR2 (stepped portion ST). Moreover, even when the air gap Ag3 is formed, the support of the insulating layer 42 formed in the air gap Ag2 prevents collapse or sagging of the structure of the word line conductive layers 41a-41d in the peripheral region AR2. As a result, in the above-described first embodiment, short-circuits and the like arising due to sagging of the word line conductive layers 41a-41d in the stepped portion ST can be suppressed.

Second Embodiment

Figure 15A:
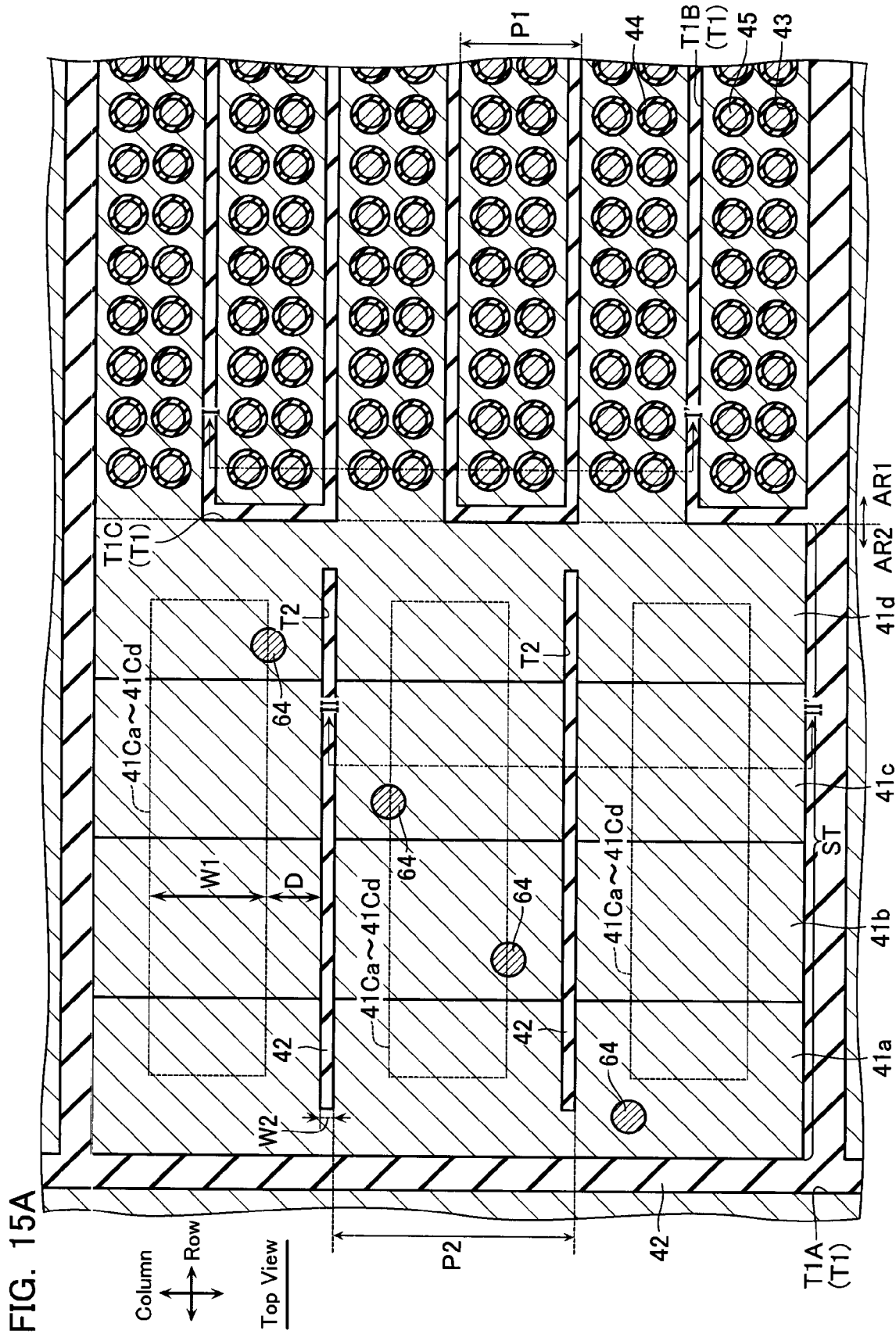
FIG. 15A is a schematic top view of a nonvolatile semiconductor memory device in accordance with a second embodiment.
Figure 15B:
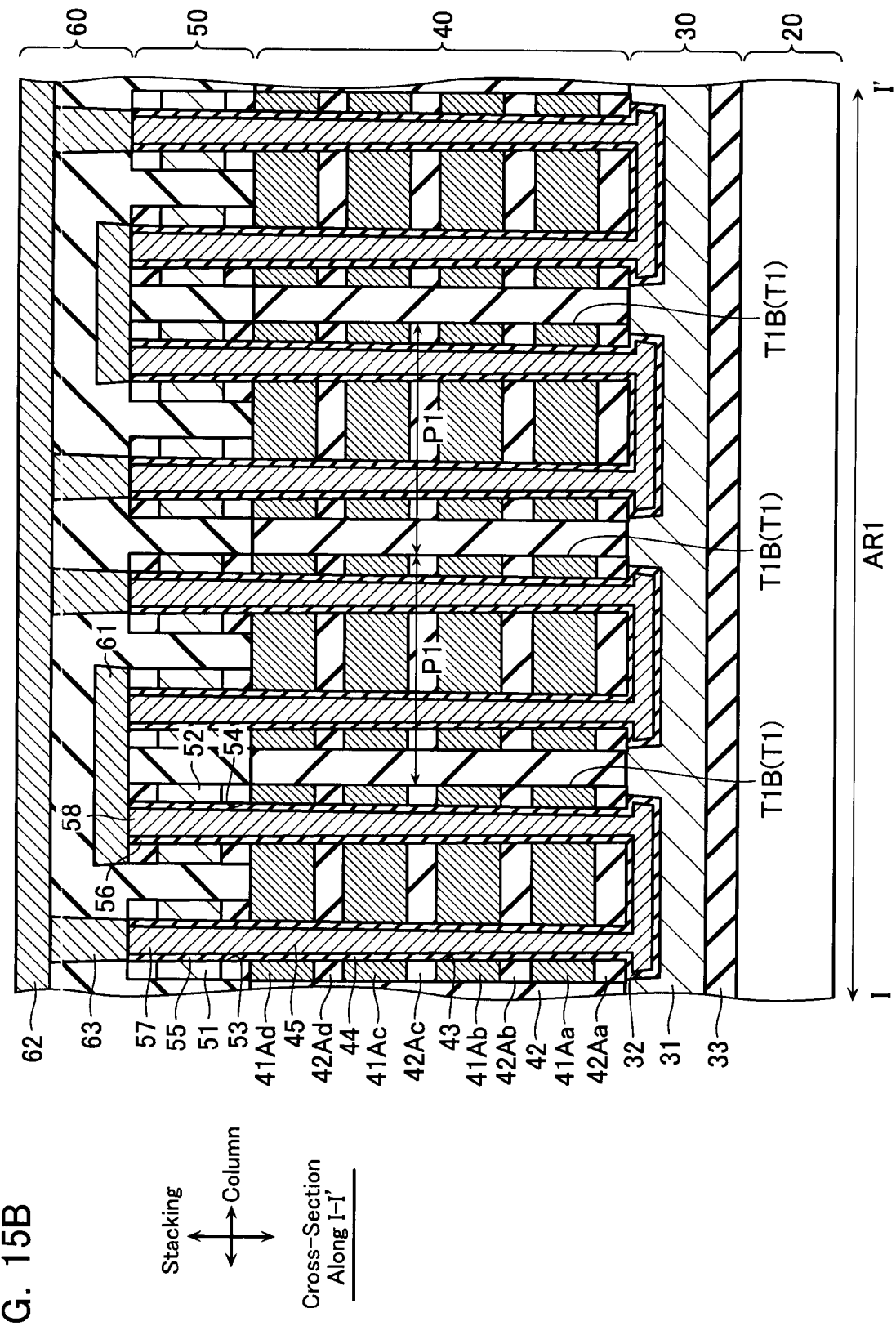
FIG. 15B is a cross-sectional view taken along the line I-I' of FIG. 15A.
Figure 15C:
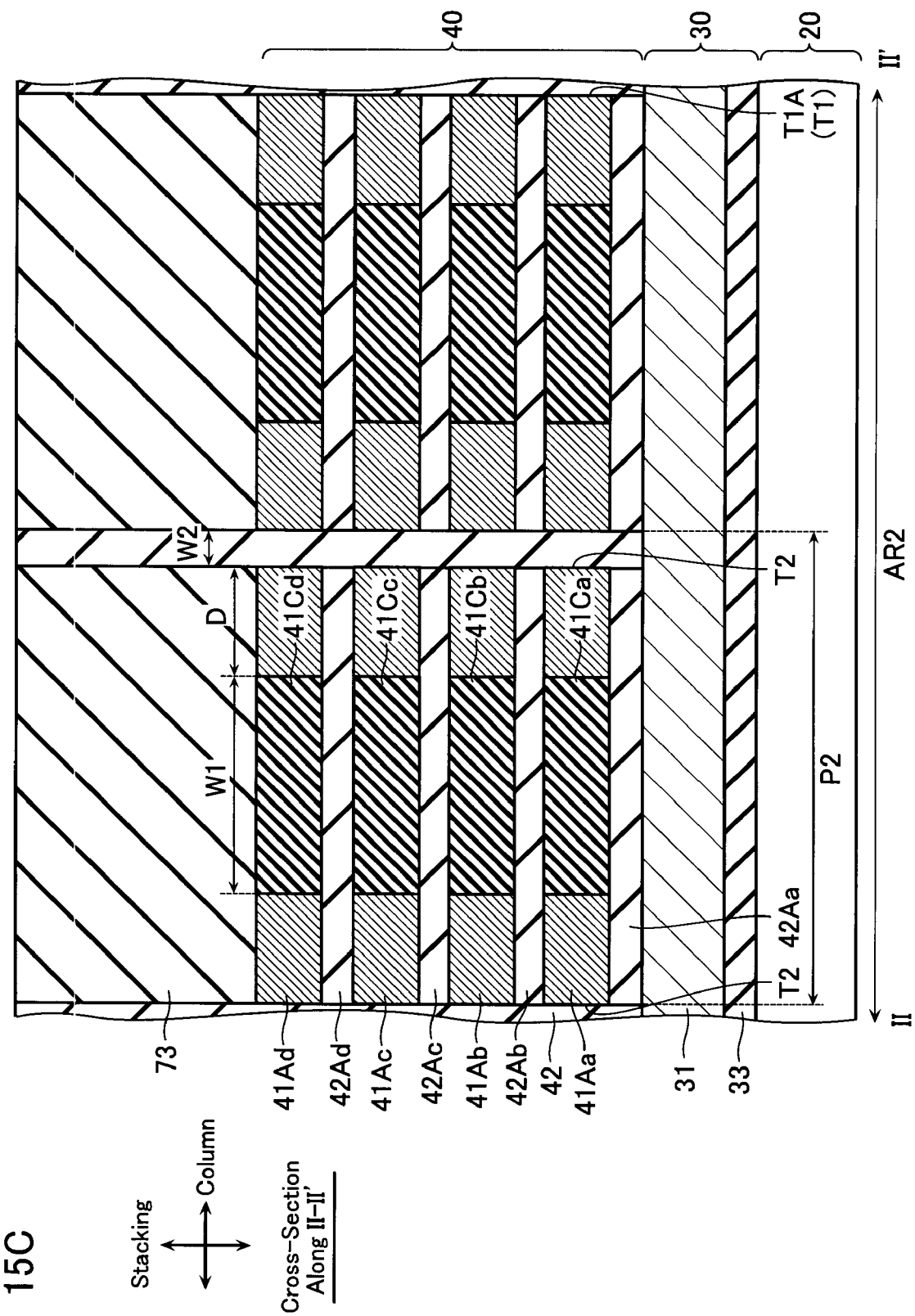
FIG. 15C is a cross-sectional view taken along the line II-II' of FIG. 15A.

Configuration of Nonvolatile Semiconductor Memory Device in accordance with Second Embodiment Next, a stacking structure of a nonvolatile semiconductor memory device in accordance with a second embodiment is described with reference to FIGS. 15A-15C. FIG. 15A is a schematic top view of the nonvolatile semiconductor memory device in accordance with the second embodiment. FIG. 15B is a cross-sectional view taken along the line I-I' of FIG. 15A, and FIG. 15C is a cross-sectional view taken along the line II-II' of FIG. 15A. Note that in the second embodiment, identical symbols are assigned to configurations similar to those in the first embodiment and descriptions thereof are omitted.

The nonvolatile semiconductor memory device in accordance with the second embodiment includes the memory region AR1 and the peripheral region AR2 substantially identical to the first embodiment, as shown in FIG. 15A.

In the second embodiment, the memory transistor layer 40 includes word line conductive layers 41Aa-41Ad configured by a metal such as tungsten (W), as shown in FIG. 15B. The word line conductive layers 41Aa-41Ad include the trenches T1 and T2, and do not include the trenches T3 as in the first embodiment, as shown in FIG. 15A.

Furthermore, the memory transistor layer 40 includes insulating layers 41Ca-41Cd in the peripheral region AR2, the insulating layers 41Ca-41Cd being formed in the same layer as the word line conductive layers 41Aa-41Ad and being formed so as to surround the word line conductive layers 41Aa-41Ad, as shown in FIG. 15C. The insulating layers 41Ca-41Cd are configured by silicon nitride (SiN). Upper surfaces and lower surfaces of the word line conductive layers 41Aa-41Ad and the insulating layers 41Ca-41Cd are sandwiched by insulating layers 42Aa-42Ad. The insulating layers 42Aa-42Ad are configured by silicon oxide (SiO$_2$). A distance D in the column direction between the insulating layers 41Ca-41Cd and the trench T2 is less than a width W1 in the column direction of the insulating layers 41Ca-41Cd. Further, a width W2 in the column direction of the trench T2 is less than the distance D.

[Method of Manufacturing Nonvolatile Semiconductor Memory Device in accordance with Second Embodiment]

Next, a method of manufacturing the nonvolatile semiconductor memory device in accordance with the second embodiment is described with reference to FIGS. 16A-19B. FIGS. 16A-19B are views showing manufacturing processes of the nonvolatile semiconductor memory device in accordance with the second embodiment.

In the second embodiment, first, the processes shown in FIGS. 6A and 6B of the first embodiment are performed. Next, and differing from the first embodiment, silicon oxide (SiO$_2$) and silicon nitride (SiN) are alternately deposited to form the insulating layers 42Aa-42Ad and the insulating layers 41Ca-41Cd. Next, processes similar to those of FIGS. 8A, 8B, 9A, and 9B in the first embodiment are executed.

Subsequently, the trenches T1 and T2 similar to those of the first embodiment are formed, as shown in FIGS. 16A and 16B.

Figure 17A:
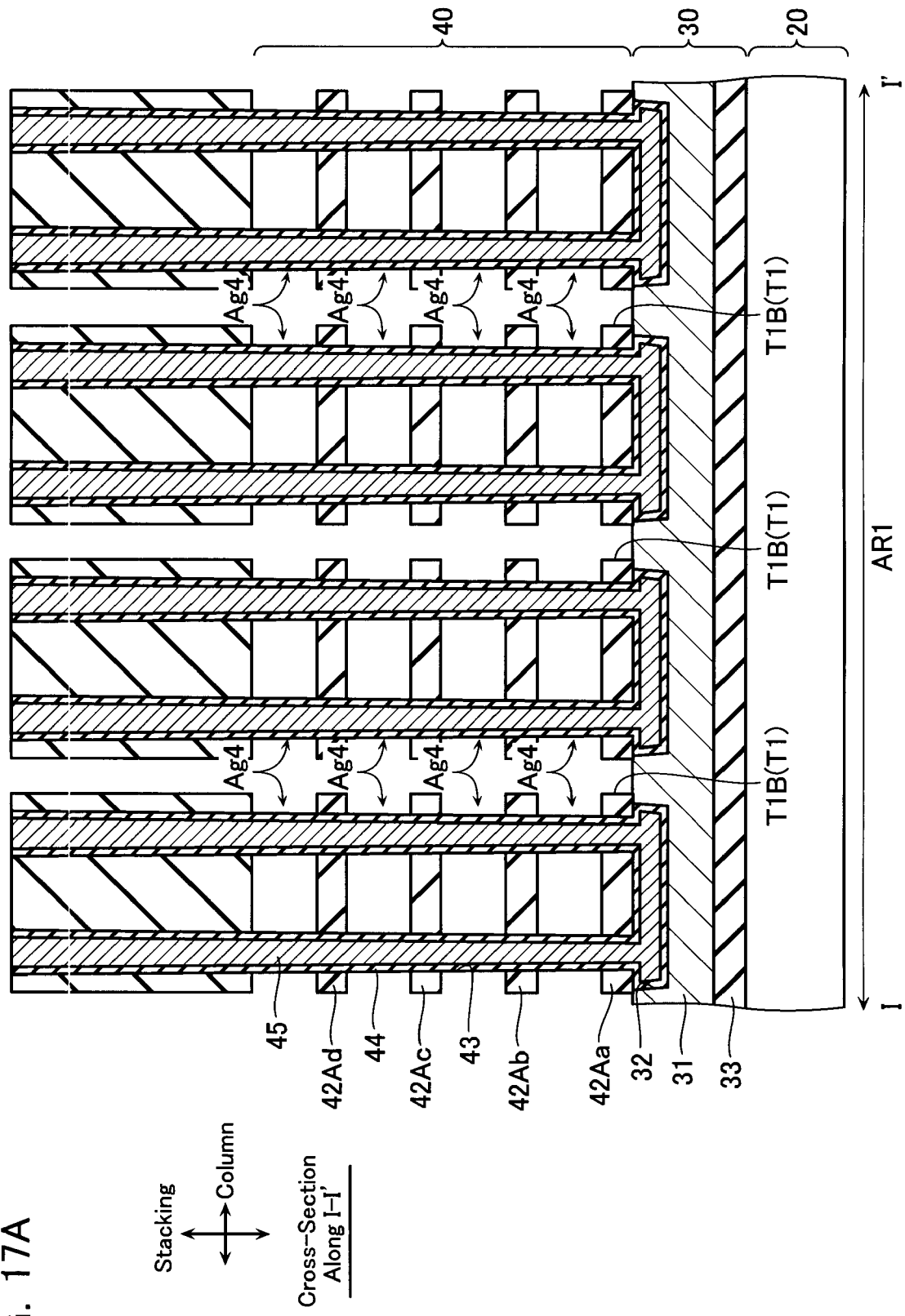
FIG. 17A is a cross-sectional view taken along the line I-I' of FIG. 10A.
Figure 17B:
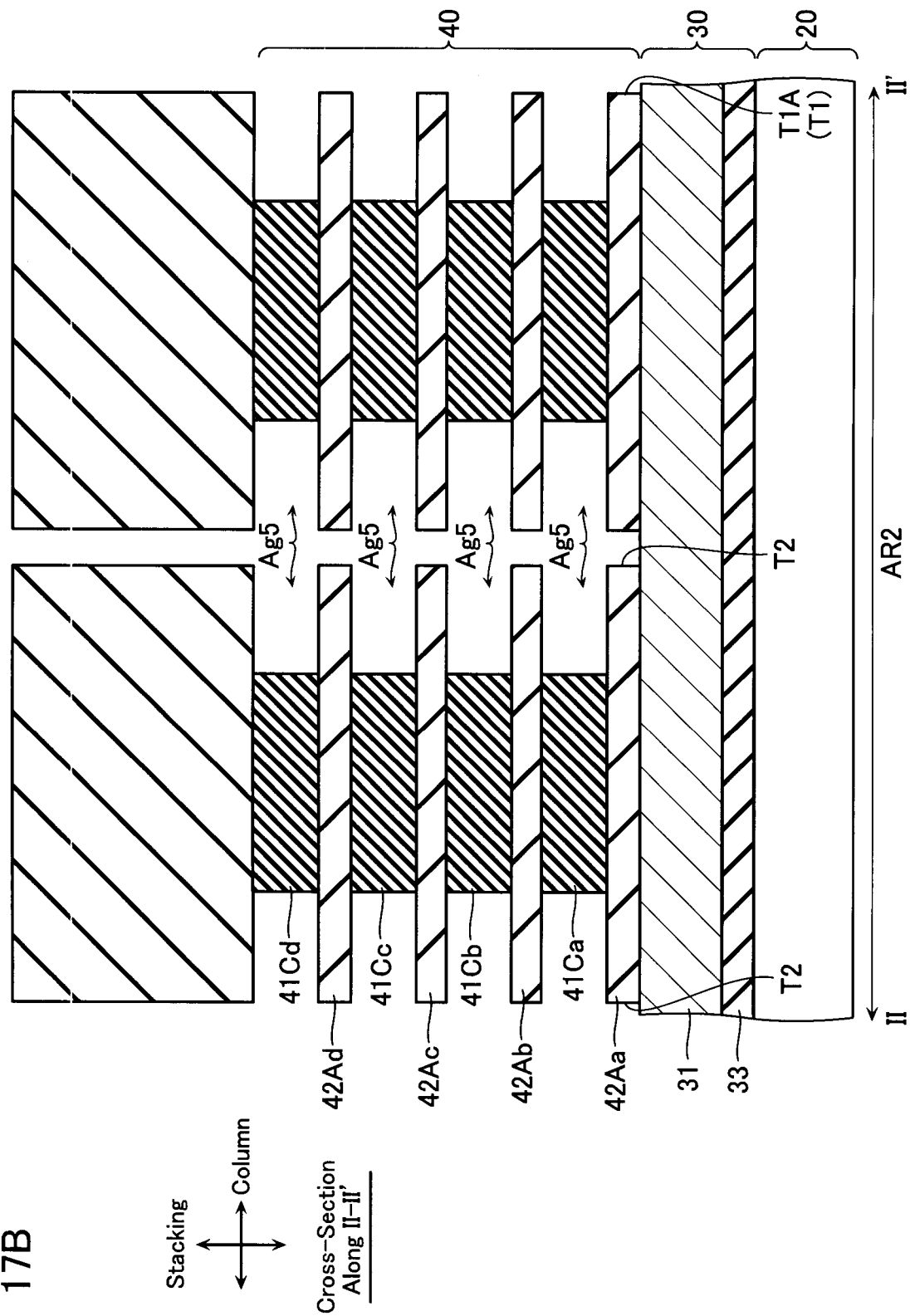
FIG. 17B is a cross-sectional view taken along the line II-II' of FIG. 10A.

Next, the insulating layers 41Ca-41Cd in the memory region AR1 are removed via the trench T1 to form an air gap Ag4 in the removed portion, as shown in FIGS. 17A and 17B. At the same time, side surfaces of the insulating layers 41Ca- 41Cd in the peripheral region AR2 facing the trench T2 are cutback (recessed) to form an air gap Ag5 in the cut back portion.

Now, in the memory region AR1, the insulating layers 41Ca-41Cd are completely removed. That is, the insulating layers 42Aa-42Ad become supported by the U-shaped semiconductor layer 45. Furthermore, the trenches T2 are formed with a greater separation than the trenches T1, and the insulating layers 41Ca-41Cd in the peripheral region AR2 have only their side surface removed. That is, the insulating layers 42Aa-42Ad become supported by a remaining portion of the insulating layers 41Ca-41Cd which has a width in column direction as shown in FIG. 17B.

Then, as shown in FIGS. 18A and 18B, tungsten (W) is deposited to fill the air gap Ag4 via the trench T1 in the memory region AR1, thereby forming a layer 41A. At the same time, the layer 41A is formed in the peripheral region AR2 filling the air gap Ag5 via the trench T2.

Figure 19B:
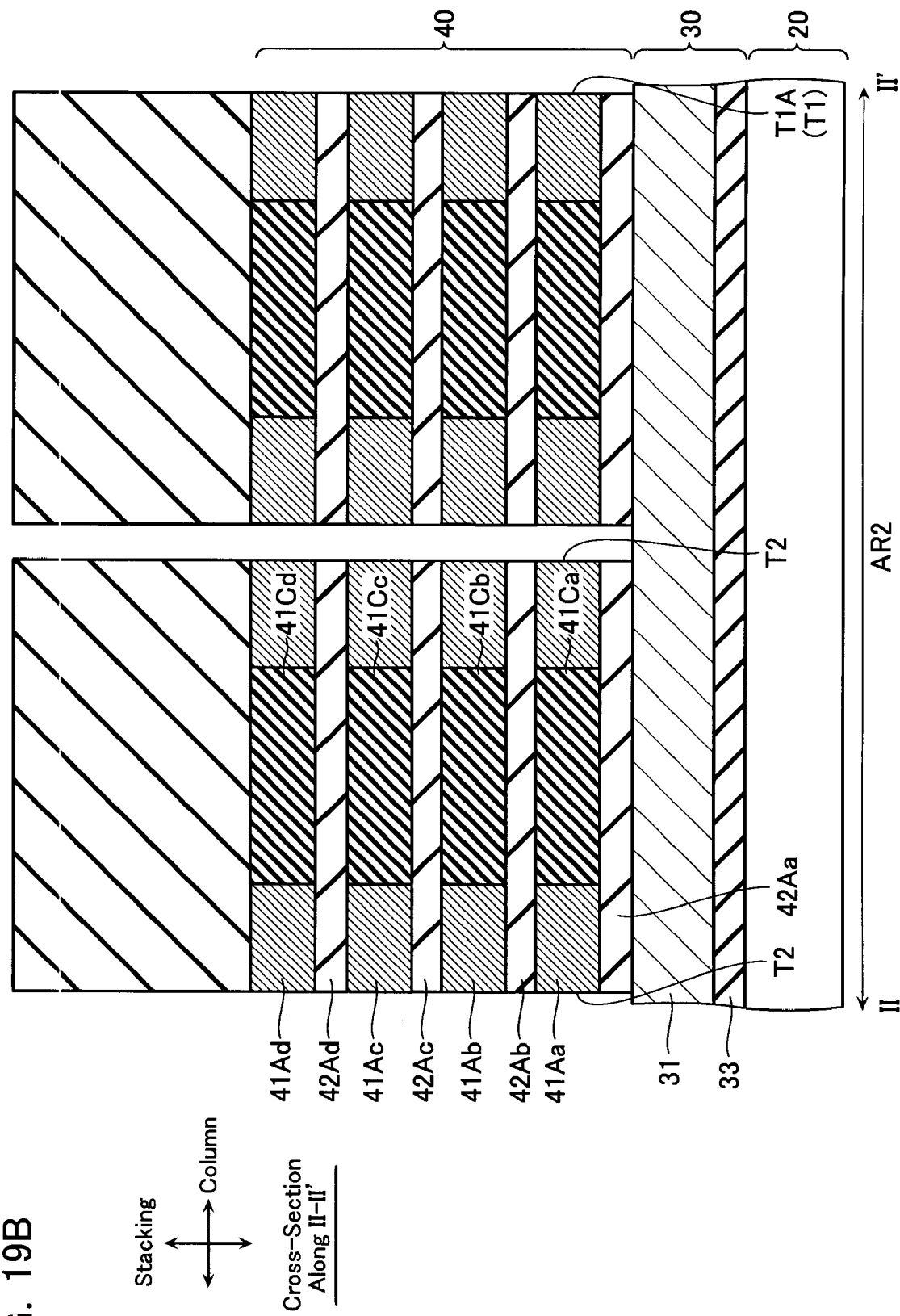
FIG. 19B is a cross-sectional view taken along the line II-II' of FIG. 10A.

Next, the layer 41A formed on a side surface of the trench T1 in the memory region AR1 and the layer 41A formed on a side surface of the trench T2 in the peripheral region AR2 are removed, as shown in FIGS. 19A and 19B. Through this process, the layer 41A becomes the word line conductive layers 41Aa-41Ad. Subsequently, silicon oxide (SiO$_2$) is deposited filling the trenches T1 and T2, thereby forming the insulating layer 42. Then, the word line conductive layers 41Aa-41Ad in the peripheral region AR2 are processed in a stepped shape to form the stepped portion ST.

The nonvolatile semiconductor memory device in accordance with the second embodiment does not require the processes shown in FIGS. 13A, 13B, and 14 of the first embodiment, and is thus able to improve yield over the first embodiment.

Other Embodiments

While certain embodiments of the invention have been described, these embodiments have been presented by way of example only, and are not intended to limit the scope of the invention. Indeed, the novel methods and systems described herein may be embodied in a variety of other forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

For example, a method of manufacturing a nonvolatile semiconductor memory device, the nonvolatile semiconductor memory device including a first region having a plurality of electrically rewritable memory cells disposed therein, and a second region adjacent to the first region, the method comprising:

stacking a plurality of conductive layers and sacrifice layers alternately on a substrate in the first region and the second region;

forming a hole in the first region penetrating the plurality of conductive layers and sacrifice layers;

forming a charge storage layer on a side surface of the hole;

forming a semiconductor layer to fill the hole;

forming a plurality of first trenches in the first region, the first trenches being arranged so as to have a first pitch in a first direction, the first trenches being formed in stripes having a second direction as a longitudinal direction, the second direction being perpendicular to the first direction, and the first trenches being formed penetrating the plurality of conductive layers and sacrifice layers, and forming a plurality of second trenches in the second region, the second trenches being arranged so as to have a second pitch in the first direction, the second trenches being formed in stripes having the second direction as a longitudinal direction, and the second trenches being formed penetrating the plurality of conductive layers and sacrifice layers;

forming a plurality of first air gaps in the first region by removing the sacrifice layers via the first trenches, and forming a plurality of second air gaps in the second region by cutting back a side surface of the sacrifice layers facing the second trench;

forming a plurality of first insulating layers to fill the first trenches, the second trenches, the first air gaps and the second air gaps;

forming a plurality of third trenches in the second region subsequent to forming the first insulating layers, the third trenches penetrating the conductive layers and the sacrifice layers;

forming a plurality of third air gaps by removing the sacrifice layers via the third trenches; and forming a plurality of second insulating layers to fill the third trenches and the third air gaps.

For example, the second trenches are longer in the second direction than the third trenches.

For example, the method of manufacturing a nonvolatile semiconductor memory device, the nonvolatile semiconductor memory device including a first region having a plurality of electrically rewritable memory cells disposed therein, and a second region adjacent to the first region, may be a method comprising:

stacking a plurality of first insulating layers and sacrifice layers alternately on a substrate along a first region and a second region;

forming a hole in the first region penetrating the plurality of first insulating layers and sacrifice layers;

forming a charge storage layer on a side surface of the hole;

forming a semiconductor layer to fill the hole;

forming a plurality of first trenches in the first region, the first trenches being arranged so as to have a first pitch in a first direction, the first trenches being formed in stripes having a second direction as a longitudinal direction, the second direction being perpendicular to the first direction, and the first trenches being formed penetrating the plurality of first insulating layers and sacrifice layers, and forming a plurality of second trenches in the second region, the second trenches being arranged so as to have a second pitch in the first direction, the second trenches being formed in stripes having the second direction as a longitudinal direction, and the second trenches being formed penetrating the plurality of first insulating layers and sacrifice layers;

forming a plurality of first air gaps in the first region by removing the sacrifice layers via the first trenches, and forming a plurality of second air gaps in the second region by cutting back a side surface of the sacrifice layers facing the second trenches;

forming a plurality of conductive layers in the first region and the second region to fill the first air gap and the second air gaps; and forming a plurality of second insulating layers in the first region and the second region to fill the first trenches and the second trenches.

Further, for example, a distance in the first direction between the sacrifice layers and the second trenches may be smaller than a width in the first direction of the sacrifice layers, and a width in the first direction of the second trenches may be smaller than the distance in the first direction between the sacrifice layers and the second trenches.

For example, the trenches T3 in the first embodiment need not be formed with the second pitch P2 and requires to be formed sandwiched by the trench T2.

For example, the word line conductive layers 41Aa-41Ad in the second embodiment may be configured by polysilicon (poly-Si) or the like, rather than a metal layer.

For example, a void may be formed in a boundary between the insulating layer 42 and 421 in the peripheral region AR2. Such voids may be shown in a cross sectional view taken along column direction which is corresponding to FIG. 4C.

For example, the nonvolatile semiconductor memory device in accordance with the above-described embodiments includes a U-shaped semiconductor layer 45, but may include, for example, an I-shaped semiconductor layer extending in the stacking direction such as described in the Japanese Patent Application No. 2006-86674, filed on Mar. 27, 2006, and the American patent application Ser. No. 11/654,551, filed on Jan. 18, 2007, the entire contents of which are incorporated herein by reference, in place of the U-shaped semiconductor layer 45.

What is claimed is:

1. A nonvolatile semiconductor memory device including a first region having a plurality of electrically rewritable memory cells disposed therein, and a second region adjacent to the first region, the nonvolatile semiconductor memory device comprising:
   a plurality of conductive layers stacked in the first region and the second region and functioning as control electrodes of the memory cells in the first region;
   a semiconductor layer surrounded by the conductive layers in the first region, including a columnar portion extending in a perpendicular direction with respect to a substrate, and functioning as a body of the memory cells; and
   a charge storage layer formed between the conductive layers and a side surface of the columnar portion and configured to enable storage of a charge and thereby retain data of the memory cells,
   the conductive layers comprising:
   a plurality of first trenches arranged in the first region so as to have a first pitch in a first direction, the first trenches being formed in stripes having a second direction as a longitudinal direction, the second direction being perpendicular to the first direction, and the first trenches being formed penetrating the plurality of conductive layers;
   a plurality of second trenches arranged in the second region so as to have a second pitch in the first direction, the second trenches being formed in stripes having the second direction as a longitudinal direction, and the second trenches being formed penetrating the plurality of conductive layers; and
   a plurality of third trenches arranged in the second region so as to have a third pitch in the first direction and so as to be sandwiched by the second trenches, the third trenches being formed in stripes having the second direction as a longitudinal direction, and the third trenches being formed penetrating the plurality of conductive layers.

2. The nonvolatile semiconductor memory device according to claim 1,
   wherein the second pitch is substantially twice the first pitch, and
   wherein the third pitch is substantially equal to the second pitch.

3. The nonvolatile semiconductor memory device according to claim 1,
   wherein the second trenches are longer in the second direction than the third trenches.

4. The nonvolatile semiconductor memory device according to claim 1, further comprising:
   a first insulating layer filling the second trench; and
   a second insulating layer filling the third trench.

5. The nonvolatile semiconductor memory device according to claim 4,
   wherein the first insulating layer and the second insulating layer are configured by silicon oxide.

6. The nonvolatile semiconductor memory device according to claim 4,
   wherein a portion of the first insulating layer and a portion of the second insulating layer are formed in a region sandwiched by the conductive layers in the perpendicular direction with respect to the substrate.

7. The nonvolatile semiconductor memory device according to claim 6,
   wherein a boundary line between the portion of the first insulating layer and the portion of the second insulating layer is generally perpendicular to the substrate.

8. The nonvolatile semiconductor memory device according to claim 1,
   wherein the second pitch is substantially twice the first pitch,
   wherein the third pitch is substantially equal to the second pitch, and
   wherein the second trenches are longer in the second direction than the third trenches.

9. The nonvolatile semiconductor memory device according to claim 1,
   wherein the plurality of conductive layers include a stepped portion in the second region, the stepped portion being formed in a stepped shape such that positions of ends of the conductive layers differ.

10. The nonvolatile semiconductor memory device according to claim 1,
    wherein the plurality of conductive layers are divided in a comb shape in the first region.

11. The nonvolatile semiconductor memory device according to claim 1,
    wherein the semiconductor layer includes a joining portion configured to join lower ends of a pair of the columnar portions.

12. A nonvolatile semiconductor memory device including a first region having a plurality of electrically rewritable memory cells disposed therein, and a second region adjacent to the first region, the nonvolatile semiconductor memory device comprising:
    a plurality of conductive layers stacked in the first region and the second region and functioning as control electrodes of the memory cells in the first region;
    a semiconductor layer surrounded by the conductive layers in the first region, including a columnar portion extending in a perpendicular direction with respect to a substrate, and functioning as a body of the memory cells;
    a charge storage layer formed between the conductive layers and a side surface of the columnar portion and configured to enable storage of a charge and thereby retain data of the memory cells; and
    a plurality of insulating layers each provided in the second region in the same layer as the conductive layers and formed surrounded by the conductive layers,
    the conductive layers comprising:
    a plurality of first trenches arranged in the first region so as to have a first pitch in a first direction, the first trenches being formed in stripes having a second direction as a longitudinal direction, the second direction being perpendicular to the first direction, and the first trenches being formed penetrating the plurality of conductive layers; and a plurality of second trenches arranged in the second region so as to have a second pitch in the first direction, the second trenches being formed in stripes having the second direction as a longitudinal direction, and the second trenches being formed penetrating the plurality of conductive layers, the insulating layers being arranged in the second region so as to have a third pitch in the first direction, and being formed in stripes having the second direction as a longitudinal direction.

13. The nonvolatile semiconductor memory device according to claim 12, wherein a distance in the first direction between the insulating layers and the second trenches is smaller than a width in the first direction of the insulating layers, and wherein a width in the first direction of the second trenches is smaller than the distance in the first direction between the insulating layers and the second trenches.

14. The nonvolatile semiconductor memory device according to claim 12, wherein the second pitch is substantially twice the first pitch, and wherein the third pitch is substantially equal to the second pitch.

15. The nonvolatile semiconductor memory device according to claim 12, wherein the insulating layers are configured by silicon nitride.

16. The nonvolatile semiconductor memory device according to claim 12, wherein the plurality of conductive layers are configured by a metal.

17. The nonvolatile semiconductor memory device according to claim 12, wherein the plurality of conductive layers include a stepped portion in the second region, the stepped portion being formed in a stepped shape such that positions of ends of the conductive layers differ.

18. The nonvolatile semiconductor memory device according to claim 12, wherein the plurality of conductive layers are divided in a comb shape in the first region.

19. The nonvolatile semiconductor memory device according to claim 12, wherein the semiconductor layer includes a joining portion configured to join lower ends of a pair of the columnar portions.

20. The nonvolatile semiconductor memory device according to claim 12, wherein a distance in the first direction between the insulating layers and the second trenches is smaller than a width in the first direction of the insulating layers, wherein a width in the first direction of the second trenches is smaller than the distance in the first direction between the insulating layers and the second trenches, wherein the second pitch is substantially twice the first pitch, and wherein the third pitch is substantially equal to the second pitch.

* * * * *